(12) United States Patent
Chataigner et al.

(10) Patent No.: US 9,252,705 B2
(45) Date of Patent: Feb. 2, 2016

(54) OSCILLATOR HAVING DUAL TOPOLOGY

(71) Applicant: ST-Ericsson SA, Plan-les-Ouates (CH)

(72) Inventors: Emmanuel Chataigner, Saint Martin (FR); Sebastien Dedieu, La Terrasse (FR)

(73) Assignee: ST-ERICSSON SA, Plan-les-Ouates (CH)

( * ) Notice: Subject to any disclaimer, the term of this patent is extended or adjusted under 35 U.S.C. 154(b) by 0 days.

(21) Appl. No.: 14/362,279

(22) PCT Filed: Dec. 6, 2012

(86) PCT No.: PCT/EP2012/074716
§ 371 (c)(1),
(2) Date: Jun. 2, 2014

(87) PCT Pub. No.: WO2013/083735
PCT Pub. Date: Jun. 13, 2013

(65) Prior Publication Data
US 2014/0327487 A1   Nov. 6, 2014

Related U.S. Application Data

(60) Provisional application No. 61/582,995, filed on Jan. 4, 2012.

(30) Foreign Application Priority Data

Dec. 6, 2011   (EP) ..................................... 11306619

(51) Int. Cl.
*H03B 5/12*   (2006.01)
*H03B 5/36*   (2006.01)
*H03B 25/00*   (2006.01)

(52) U.S. Cl.
CPC .............. *H03B 5/1228* (2013.01); *H03B 5/124* (2013.01); *H03B 5/1215* (2013.01); *H03B 5/1262* (2013.01); *H03B 5/368* (2013.01); *H03B 25/00* (2013.01)

(58) Field of Classification Search
CPC ................................ H03B 5/1228; H03B 5/12

USPC ......... 331/107 R, 108 R, 117 FE, 117 R, 167
See application file for complete search history.

(56) References Cited

U.S. PATENT DOCUMENTS 5,629,652 A    5/1997  Weiss
6,650,195 B1 * 11/2003  Brunn et al. .............. 331/177 V
(Continued)

FOREIGN PATENT DOCUMENTS

| EP | 0 803 972 A1 | 10/1997 |
| FR | 2 947 118 A1 | 12/2010 |
| JP | 2001-267846 A | 9/2001 |

OTHER PUBLICATIONS

International Search Report issued in corresponding International application No. PCT/EP2012/074716, date of mailing Jun. 24, 2013.
(Continued)

*Primary Examiner* — Jeffrey Shin
(74) *Attorney, Agent, or Firm* — Patent Portfolio Builders PLLC

(57) ABSTRACT

An oscillator (200, 300, 350) comprises a tank circuit (100), a first transistor (M1c) and a second transistor (M1r), and the second transistor (M1r) occupies an area of silicon that is smaller than an area of silicon occupied by the first transistor (M1c). A switching apparatus (Sw1 . . . Sw14) selects either one of a first oscillator topology and a second oscillator topology, where in the first oscillator topology, the tank circuit (100) is coupled to the first transistor (M1c) in a first feedback configuration to provide feedback around the first transistor (M1c), and in the second oscillator topology, the tank circuit (100) is coupled to the second transistor (M1r) in a second feedback configuration that is different to the first feedback configuration to provide feedback around the second transistor (M1r).

14 Claims, 18 Drawing Sheets

(56) References Cited

U.S. PATENT DOCUMENTS

2008/0258828 A1* 10/2008 Sutardja ............... 331/117 R
2010/0295627 A1* 11/2010 Okada .................. 331/117 FE
2011/0018649 A1    1/2011 David et al.
2011/0074513 A1    3/2011 Bao

OTHER PUBLICATIONS

Written Opinion of the International Searching Authority issued in corresponding International application No. PCT/EP2012/074716, date of mailing Jun. 24, 2013.

Safarian, Zahra et al., "Wideband Multi-Mode CMOS VCO Design Using Coupled Inductors," IEEE Transactions on Circuits and Systems, I: Regular Papers, vol. 56, No. 8, Aug. 31, 2009, pp. 1830-1843, XP011333505, ISSN: 1549-8328, DOI: 10.1109/TCSI.2009.2028414.

Baek, Donghuyn et al., "A Dual-Band (13122-GHz) VCO Based on Resonant Mode Switching," IEEE Microwave and Wireless Components Letter, vol. 13, No. 10, Oct. 31, 2003, pp. 443-445, XP011102138, ISSN: 1531-1309, DOI: 10.1109/LMWC.2003.817114.

* cited by examiner

OSCILLATOR HAVING DUAL TOPOLOGY

TECHNICAL FIELD

The present disclosure relates to an oscillator and to a method of operating an oscillator, and has application, in particular but not exclusively, in clock signal generation, for example for wireless devices.

BACKGROUND

Modern wireless devices require some clock reference signals to operate radio communications, broadcast frequency modulation (FM) radio reception, satellite localisation, digital processing or real time tracking. These clocks may have various noise requirements. Cellular communications, for example, will require high-quality, low-noise, high-frequency clocks, typically a few tens of megahertz, whereas real-time or FM radio applications can use low quality and lower frequency clocks, typically a few tens of kHz. Low-noise clocks are power-consumption hungry but are only needed a small portion of the time, whereas low-quality clocks consume much less power but are operated during longer periods of time.

As many modern wireless devices are battery operated, the clock systems enclosed within them should be capable of switching between different operating modes to avoid increasing power consumption, while fulfilling their quality and range of frequencies requirements.

For other devices powered by the mains, the power consumption criteria still remain of importance for environmental reasons, since modern homes use more and more communication devices which are in stand-by mode most of the time. Those communication devices are, for example, Ethernet mains plug-ins, cable-based Ethernet interfaces, television displays and computers and in the near future all kinds of domestic appliances such as washing machines or microwave ovens.

According to a first prior art, two different crystals working at two different frequencies, for example at 32 kHz and at 26 MHz, are used for clock signal generation. One drawback of this first prior art is an increased number of components, and an increased number of pins on an integrated circuit. Another drawback of this first prior art is the requirement to design two oscillators in order to accommodate the two very different frequencies.

According to a second prior art, one single crystal at the highest frequency is used and a divider is added for the stand-by mode. The load capacitance of the crystal and the current biasing of the core oscillator are decreased in order to reduce the power consumption. One drawback of this second prior art is the difficulty to optimize the oscillator to alternatively reach two different and opposite goals, that is to say low noise on the one side and low power on the other side, since the same architecture is used in both cases. In particular, the active part of the oscillator, that is to say notably the transistors making up the amplifier that builds up and sustains the oscillation, is the same, which will lead to oversized transistors for the low power mode.

According to a third prior art, for example described in U.S. Pat. No. 7,005,933, an oscillator can work in two different power modes using respectively two different current sources but with the same architecture. Here again, it is difficult to optimize both modes. Besides, oscillation is made with the help of capacitances and inductances, but there is no crystal.

An object of the present disclosure is to provide an improved oscillator and method of operating an oscillator. In particular, an object of the present disclosure is to alleviate at least partly some of the above-mentioned drawbacks.

SUMMARY

According to a first aspect, there is provided an oscillator comprising:
a tank circuit;
a first transistor and a second transistor, wherein the second transistor occupies an area of silicon that is smaller than an area of silicon occupied by the first transistor; and
a switching apparatus for selecting either one of a first oscillator topology and a second oscillator topology, wherein
in the first oscillator topology, the tank circuit is coupled to the first transistor in a first feedback configuration to provide feedback around the first transistor; and,
in the second oscillator topology, the tank circuit is coupled to the second transistor in a second feedback configuration that is different to the first feedback configuration to provide feedback around the second transistor.

According to a second aspect, there is provided a method of operating an oscillator comprising selecting either one of a first oscillator topology and a second oscillator topology, wherein selecting the first oscillator topology comprises coupling a tank circuit to a first transistor in a first feedback configuration to provide feedback around the first transistor, and selecting the second oscillator topology comprises coupling the tank circuit to a second transistor in a second feedback configuration that is different to the first feedback configuration to provide feedback around the second transistor, wherein the second transistor occupies an area of silicon that is smaller than an area of silicon occupied by the first transistor.

By selecting either one of a first oscillator topology and a second oscillator topology, different oscillator properties can be provided, according to prevailing requirements. Such different oscillator properties may relate to, for example, different power consumption, different noise performance and/or different frequency. Furthermore, by providing a first transistor for use in the first oscillator topology and a second transistor for use in the second oscillator topology, different oscillator properties can be further provided, according to prevailing requirements. In particular, as the second transistor occupies an area of silicon that is smaller than the area of silicon occupied by the first transistor, power consumption can be lower when the oscillator is operated with the second oscillator topology than with the first oscillator topology. By, in the first oscillator topology, coupling the tank circuit to the first transistor in a first feedback configuration to provide feedback around the first transistor and by, in the second oscillator topology, coupling the tank circuit to the second transistor in a second feedback configuration that is different to the first feedback configuration to provide feedback around the second transistor, different oscillator properties can be further provided according to prevailing requirements. This enables independence between the first and second oscillator topologies, enabling different oscillator properties to be provided according to prevailing requirements, whilst enabling the tank circuit to be used for both the first and second oscillator topologies, thereby enabling a reduction in number of electronic components, and in particular a reduction in the area of silicon required for an integrated circuit embodying the oscillator.

The tank circuit may comprise an inductive device having a first port coupled to a first port of a first capacitive device and having a second port coupled to a first port of a second capacitive device, the first capacitive device may comprise a first capacitive element coupled between the first port of the first capacitive device and a second port of the first capacitive device and a second capacitive element coupled between the second port of the first capacitive device and a first voltage rail, and the second capacitive device may comprise a third capacitive element coupled between the first port of the second capacitive device and a second port of the second capacitive device and a fourth capacitive element coupled between the second port of the second capacitive device and the first voltage rail. Likewise, the method may comprise providing such a tank circuit. This feature can provide versatility, enabling the tank circuit to be coupled to the first and second transistor in different feedback configurations for the first and second oscillator topologies and can provide different capacitance values and enable both differential and non-differential signals to be generated by the oscillator.

At least one of the first, second, third and fourth capacitive elements may comprise a variable capacitance. Likewise, the method may comprise providing at least one of the first, second, third and fourth capacitive elements having a variable capacitance. This feature can enable further versatility in selecting different capacitance values for the first and second oscillator topologies.

The oscillator may comprise a third transistor, wherein the second transistor occupies an area of silicon that is smaller than an area of silicon occupied by the third transistor, and whereby:

in the first feedback configuration the first and second capacitive elements may constitute a first voltage divider arranged to feed back a proportion of a voltage at a gate of the first transistor to a first terminal of the first transistor and the third and fourth capacitive elements may constitute a second voltage divider arranged to feed back a proportion of a voltage at a gate of the third transistor to a first terminal of the third transistor; and in the second feedback configuration the first and second capacitive devices may constitute a third voltage divider arranged to feed back a proportion of a voltage at a first terminal of the second transistor to a gate of the second transistor.

Likewise, the method may comprise:

in the first feedback configuration, providing the first and second capacitive elements as a first voltage divider arranged to feed back a proportion of a voltage at a gate of the first transistor to a first terminal of the first transistor and providing the third and fourth capacitive elements as a second voltage divider arranged to feed back a proportion of a voltage at a gate of a third transistor to a first terminal of the third transistor, wherein the second transistor occupies an area of silicon that is smaller than an area of silicon occupied by the third transistor; and in the second feedback configuration, providing the first and second capacitive devices as a third voltage divider arranged to feed back a proportion of a voltage at a first terminal of the second transistor to a gate of the second transistor.

This feature can enable the oscillator to, with the first oscillator topology employing the first feedback configuration, generate a differential signal, that is, a balanced signal comprising inverse signal components, and with the second oscillator topology employing the second feedback configuration, generate a non-differential signal, that is, an unbalanced, or single-ended, signal, whilst consuming less power in the second oscillator topology than in the first oscillator topology. Furthermore, in the first feedback configuration, the first and second capacitive elements, and the third and fourth capacitive elements, constituted as respective first and second voltage dividers, and, in the second feedback configuration, the first and second capacitive devices, which comprise the respective first, second, third and fourth capacitive elements, constituted as a third voltage divider, enable widely differing load capacitances to be provided for the inductive device.

In a first embodiment, the oscillator may comprise a first resistive element coupled between the first and second ports of the inductive device;

the first port of the inductive device may be coupled to the second port of the first capacitive device by means of a second resistive element;

the second port of the inductive device may be coupled to the second port of the second capacitive device by means of a third resistive element;

the gate of the first transistor may be coupled to a first bias voltage rail by means of a fourth resistive element, and to the first port of the inductive device, and the first terminal of the first transistor may be coupled to the second port of the first capacitive device;

the gate of the second transistor may be coupled to the first port of the inductive device, the first terminal of the second transistor may be coupled to the second port of the inductive device by means of a fifth switch element, and a second terminal of the second transistor device may be coupled to a second voltage rail;

the gate of the third transistor may be coupled to the first bias voltage rail by means of a fifth resistive element, and to the second port of the inductive device, and the first terminal of the third transistor may be coupled to the second port of the second capacitive device; and the switching apparatus may comprise:
  a first switch element coupled between a second terminal of the first transistor and the second voltage rail,
  a second switch element coupled in series with the fourth resistive element for decoupling the gate of the first transistor from the first bias voltage rail,
  a third switch element coupled between a second terminal of the third transistor and the second voltage rail,
  a fourth switch element coupled in series with the fifth resistive element for decoupling the gate of the third transistor from the first bias voltage rail,
  the fifth switch element,
  a first switchable current source coupled between the second port of the first capacitive device and the first voltage rail,
  a second switchable current source coupled between the second port of the inductive device and the first voltage rail, and
  a third switchable current source coupled between the second port of the second capacitive device and the first voltage rail.

Likewise, the method may comprise providing such an oscillator.

This feature enables the oscillator to be operable as a Colpitts oscillator in the first oscillator topology with a relatively low noise and a relatively high power consumption, whilst generating a differential signal, and operable as a Pierce oscillator in the second oscillator topology with a relatively high noise and low power consumption, whilst generating a non-differential signal.

Furthermore, in the first embodiment of the oscillator, the switching apparatus may comprise a control stage arranged to control the first, second, third, fourth and fifth switch elements, and the first, second and third switchable current sources such that, when the first oscillator topology is selected:
the first, second, third and fourth switch elements each have a relatively low impedance state;
the fifth switch element has a relatively high impedance state;
the first switchable current source sources a first current;
the second switchable current source is switched off; and
the third switchable current source sources a second current; and when the second oscillator topology is selected:
the first, second, third and fourth switch elements each have a relatively high impedance state;
the fifth switch element has a relatively low impedance state;
the first and third switchable current sources are each switched off and have a relatively high impedance; and
the second switchable current source sources a third current.

Likewise, the method may comprise providing such a switching apparatus.

This feature further enables the oscillator to be operable as a Colpitts oscillator in the first oscillator topology with a relatively low noise and a relatively high power consumption, whilst generating a differential signal, and operable as a Pierce oscillator in the second oscillator topology with a relatively high noise and low power consumption, whilst generating a non-differential signal.

Furthermore, in the first embodiment, the oscillator may comprise:
an eleventh switch element coupled in series with the second resistive element for decoupling the first port of the inductive device from the second port of the first capacitive device; and
a twelfth switch element coupled in series with the third resistive element for decoupling the second port of the inductive device from the second port of the second capacitive device;
wherein the control stage is arranged to control the eleventh and twelfth switch elements such that, when the first oscillator topology is selected, the eleventh and twelfth switch elements have a relatively high impedance state, and when the second oscillator topology is selected, the eleventh and twelfth switch elements have a relatively low impedance state.

This feature enables the tank circuit to maintain a high quality factor when the first oscillator topology is selected.

In a second embodiment of the oscillator:
the gate of the first transistor may be coupled to a first bias voltage rail by means of a fourth resistive element, to a second bias voltage rail by means of a sixth resistive element, and to the first port of the inductive device, and the first terminal of the first transistor may be coupled to the second port of the first capacitive device;
the first terminal of the second transistor may be coupled to the first port of the inductive device, and the second terminal of the second transistor may be coupled to the first voltage rail by means of a fifth capacitive element;
the gate of the third transistor may be coupled to the first bias voltage rail by means of a fifth resistive element, to the second bias voltage rail by means of a seventh resistive element, and to the second port of the inductive device, and the first terminal of the third transistor may be coupled to the second port of the second capacitive device;
the oscillator may further comprise:
a fourth transistor having a first terminal coupled to the second port of the inductive device and a second terminal coupled to the first voltage rail by means of a sixth capacitive element, wherein a gate of the fourth transistor is coupled to the first terminal of the second transistor and the first terminal of the fourth transistor is coupled to the gate of the second transistor;
a fifth transistor having a first terminal coupled to the first port of the inductive device, a second terminal coupled to the second voltage rail, and a gate of the fifth transistor coupled to the second bias voltage rail;
a sixth transistor device having a first terminal coupled to the second port of the inductive device, a second terminal coupled to the second voltage rail, and a gate of the sixth transistor coupled to the second bias voltage rail;
the second port of the first capacitive device may be coupled to the second bias voltage rail by means of an eighth resistive element;
the second port of the second capacitive device may be coupled to the second bias voltage rail by means of a ninth resistive element; and
the switching apparatus may comprise:
a first switch element coupled between a second terminal of the first transistor and the second voltage rail;
a second switch element coupled in series with the fourth resistive element for decoupling the gate of the first transistor from the first bias voltage rail;
a third switch element coupled between a second terminal of the third transistor and the second voltage rail;
a fourth switch element coupled in series with the fifth resistive element for decoupling the gate of the third transistor from the first bias voltage rail;
a sixth switch element coupling the gate of the fifth transistor and the gate of the sixth transistor to the second voltage rail;
a seventh switch element coupling the sixth and eighth resistive elements to the second bias voltage rail, and arranged for decoupling the second port of the first capacitive device and the gate of the first transistor from the second bias voltage rail;
an eighth switch element coupling the seventh and ninth resistive elements to the second bias voltage rail, and arranged for decoupling the second port of the second capacitive device and the gate of the third transistor from the second bias voltage rail;
a first switchable current source coupled between the second port of the first capacitive device and the first voltage rail;
a second switchable current source coupled between the second terminal of the second transistor and the first voltage rail;
a third switchable current source coupled between the second port of the second capacitive device and the first voltage rail; and
a fourth switchable current source coupled between the second terminal of the fourth transistor and the first voltage rail.

Likewise, the method may comprise providing such an oscillator.

This feature enables the oscillator to be operable as a Colpitts oscillator in the first oscillator topology with a relatively low noise and a relatively high power consumption, whilst generating a differential signal, and operable as a relaxation oscillator in the second oscillator topology with a relatively high noise and low power consumption.

In the second embodiment of the oscillator, the switching apparatus may comprise a control stage arranged to control the first, second, third, fourth, sixth, seventh and eighth switch elements and the first, second, third and fourth switchable current sources such that, when the first oscillator topology is selected:

the first, third, seventh and eighth switch elements each have a relatively low impedance state;

the second and fourth switch elements each have a relatively high impedance state;

the first switchable current source sources a first current;

the third switchable current source sources a second current; and the second and fourth switchable current sources are each switched off and have a relatively high impedance state; and when the second oscillator topology is selected:

the first, third, seventh and eighth switch elements each have a relatively high impedance state;

the second and fourth switch elements each have a relatively low impedance state;

the first and third switchable current sources are each switched off and have a relatively high impedance state;

the second switchable current source sources a third current; and the fourth switchable current source sources a fourth current.

Likewise, the method may comprise providing such an oscillator.

This feature further enables the oscillator to be operable as a Colpitts oscillator in the first oscillator topology with a relatively low noise and a relatively high power consumption, whilst generating a differential signal, and operable as a relaxation oscillator in the second oscillator topology with a relatively high noise and low power consumption.

Furthermore, in the second embodiment of the oscillator, the switching apparatus may further comprise an ninth switch element and a tenth switch element, wherein the first terminal of the second transistor is coupled to the first port of the inductive device by means of the ninth switch element and the first port of the fourth transistor is coupled to the second port of the inductive device by means of the tenth switch element, and the control stage may be arranged to control the eighth and tenth switch elements such that when the first oscillator topology is selected, the eighth and tenth switch elements each have a relatively high impedance state, and when the second oscillator topology is selected, the eighth and tenth switch elements each have a relatively low impedance state. Likewise, the method may comprise providing such a switching apparatus. This feature can enable reduced phase noise, in particular when the first oscillator topology is selected, by decoupling the second and fourth transistors when the first oscillator topology is selected, thereby preventing currents flowing in the second and fourth transistors, which are cross coupled.

The inductive device may be a piezoelectric device, and, in particular, the piezoelectric device may be a quartz crystal or a surface acoustic wave device. This feature enables reduced noise in the oscillator.

There is also provided an electronic apparatus comprising an oscillator according to the first aspect. In particular, the electronic apparatus may be a wireless communication apparatus.

In some embodiments, more particularly, the disclosure aims to allow for optimization of two modes of a dual core oscillator, respectively corresponding to two frequencies of clock signal generation, especially when frequencies are very different from each other, with respect to clock signal quality and global power consumption, while reducing total number of components and pins with respect to the situation where two different and completely distinct oscillators are used.

According to some embodiments of the dual core oscillator, changing the architecture allows for separate optimisation for each mode with respect to the compromise between noise and power consumption, as in systems using two completely distinct oscillators, while keeping, at the same time, the same or nearly the same tank capacitances, and especially when keeping the same crystal as well, which helps reducing the total number of components and/or pins, tending toward the simplicity and the low cost of a system that would use only a single oscillator.

According to some embodiments of the dual core oscillator, a clock signal generation method is a method of generating a clock signal of variable quality and variable frequency by reconfiguring the core oscillator in such a way that its architecture is changed alongside the load capacitance and the biasing current, thus giving one more degree of freedom for optimisation. At the same time, most tank capacitances, if not all, are kept in use while switching from one mode to the other, which helps in reducing the total number of components and pins.

According to some embodiments dual core oscillator, one first advantage is a smaller silicon area thanks to the reuse of the most area-consuming devices, namely the tank capacitances, or at the least the reuse of some of them. This advantage is more pronounced in an embodiment of the invention where no supplementary capacitors are needed in low power mode than in another embodiment of the invention which requires supplementary capacitors to operate in low-power mode. Anyway the values of those supplementary capacitors are much lower than the values of the capacitors that are kept in use when switching from one mode to the other.

According to some embodiments dual core oscillator, which keep in use the same crystal for both modes, a second advantage may be a lower calibration cost at the production stage. Each crystal oscillator may be calibrated to take into account the temperature dependence of the crystal frequency. The goal of this calibration is to find the tank capacitance value that will give the nominal frequency of the reference clock. Implicitly, this process also takes into account the nominal capacitance shift due to the manufacturing variations. Thus, reusing the very same set of capacitances alongside the same crystal for both high-power and low-power modes, or at least reusing most of those capacitances, allows to greatly simplify, and possibly suppress, the calibration step in a low-power mode and then to rely only on the calibration in a high-power mode, or at least to simplify the calibration step in the low-power mode. Using two different crystals respectively for the two different modes, cannot avoid these two calibrations since each crystal is connected to a distinct oscillator. These embodiments, that use the same crystal for both modes, can offer the best performance, because of the dual core architecture, along with a simple calibration process, as simple as in a single core architecture.

According to some embodiments dual core oscillator, which keep in use the same crystal for both modes, a third advantage is, compared to a two-clock system i.e. compared to a system working with two distinct oscillators, a better behaviour of the oscillation when it is switched from one mode to the other. Indeed, since the energy of the oscillation always remains stored within same tank or nearly the same tank, that is, the tank comprising the capacitances and the crystal, whatever the modes, and because the quality factor of the crystal is very high, the frequency and the phase of the oscillation are very likely to exhibit a continuous behaviour when switching between modes. This would not happen when switching between two distinct oscillators. Besides, since the devices making up the oscillator tank are unchanged, the external variations on them, for example aging or temperature, will produce similar effects on both oscillation modes, thus keeping all the more true the previous advantage.

According to a third aspect, there is provided a dual core oscillator adapted to switch from one architecture to the other in order to change from one generated clock signal to the other, wherein both architectures comprise at least some common tank capacitances connected together respectively in two different ways so that the global tank capacitance value is different for both architectures.

Preferred embodiments of the dual core oscillator may comprise one or more of the following features:
  all tank capacitances are common to both architectures;
  it comprises a crystal used by both architectures for clock signal generation;
  it comprises a single crystal used for clock signal generation;
  no transistor directly connected to said crystal is common to both architectures or wherein no transistor directly connected to said crystal and common to both architectures is actively used in both architectures;
  one of the architectures presents higher noise but lower power consumption than the other architecture;
  the architecture presenting higher noise but lower power consumption is adapted to generate a clock signal with a frequency at least one hundred times smaller than the other architecture;
  both architectures present respectively different biasing currents;
  it comprises current sources and it is adapted, when switching from one architecture to the other, to switch off at least one current source and to switch on at least one other current source;
  one of the architectures is a differential architecture and the other architecture is a non differential architecture;
  one of the architectures is a differential Colpitts architecture and the other architecture is a non differential Pierce architecture;
  one of the architectures is a differential Colpitts architecture and the other architecture is a differential relaxation architecture;
  a mobile user equipment of cellular network, comprising a dual core oscillator according to embodiments of the invention.

According to a fourth aspect, there is provided a method of generating a clock signal comprising a step of switching, in a dual core oscillator, from one architecture to the other in order to change from one generated clock signal to the other, wherein, when switching, at least some common tank capacitances of dual core oscillator are kept in use and wherein the relative connection of said common capacitances is changed so that the global tank capacitance value is changed.

Preferred embodiments of the method of generating a clock signal comprise one or more of the following features:
  when switching, the same crystal of dual core oscillator is kept in use for clock signal generation;

According to an embodiment of the dual core oscillator, all tank capacitances of the first architecture may be tank capacitances of the second architecture, whereas some tank capacitances of the second architecture may not be tank capacitances of the first architecture.

According to an embodiment of the dual core oscillator, in both architectures, no switch may connected in series with the tank capacitances.

The tank comprises the tank capacitances and the crystal that make up the oscillation in the dual core oscillator. The global tank capacitance value of an architecture is the value of the capacitance which would be equivalent to all the tank capacitances of this architecture taken as a whole.

BRIEF DESCRIPTION OF THE DRAWINGS

Preferred embodiments will now be described, by way of example only, with reference to the accompanying drawings, in which.

DETAILED DESCRIPTION

Figure 1:
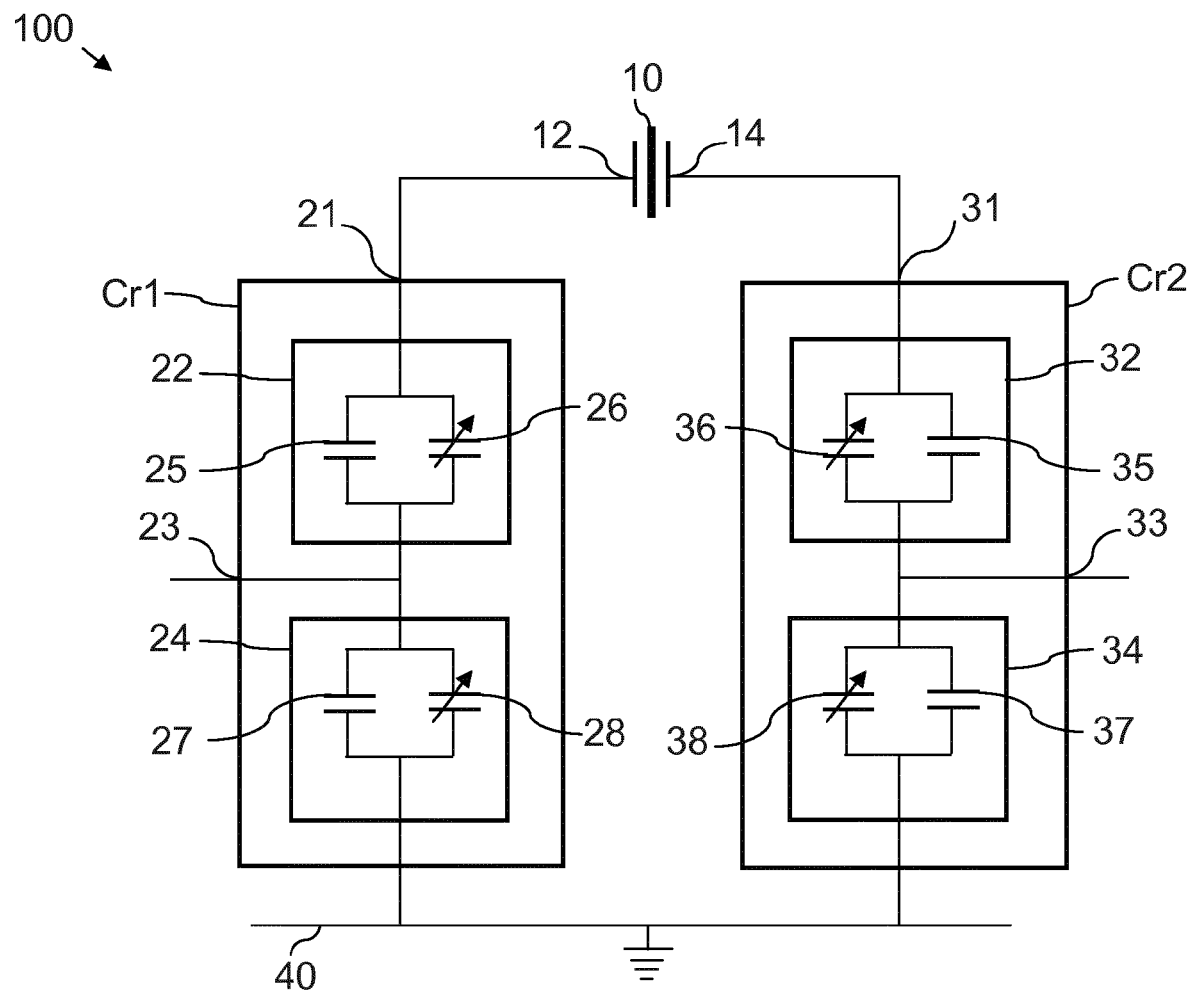
FIG. 1 is a schematic diagram of a tank circuit.

Referring to FIG. 1, the tank circuit 100 comprises an inductive device 10, which may be, for example, a piezoelectric device such as a quartz crystal or a surface acoustic wave device. The inductive device 10 has a first port 12 coupled to a first port 21 of a first capacitive device Cr1 and a second port 14 coupled to a first port 31 of a second capacitive device Cr2. The first capacitive device Cr1 comprises a first capacitive element 22 coupled between the first port 21 of the first capacitive device Cr1 and a second port 23 of the first capacitive device Cr1, and a second capacitive element 24 coupled between the second port 23 of the first capacitive device Cr1 and a first voltage rail 40, which may be at a ground potential as illustrated in FIG. 1, but alternatively may be at another potential. The second capacitive device Cr2 comprises a third capacitive element 32 coupled between the first port 31 of the second capacitive device Cr2 and a second port 33 of the second capacitive device Cr2, and a fourth capacitive element 34 coupled between the second port 33 of the second capacitive device Cr2 and the first voltage rail 40.

The first capacitive element 22 comprises a first capacitor 25, which has a fixed capacitance, coupled in parallel with a second capacitor 26, which has a variable capacitance, between the first port 21 of the first capacitive device Cr1 and the second port 23 of the first capacitive device Cr1. The second capacitive element 24 comprises a third capacitor 27, which has a fixed capacitance, coupled in parallel with a fourth capacitor 28, which has a variable capacitance, between the second port 23 of the first capacitive device Cr1 and the first voltage rail 40. The third capacitive element 32 comprises a fifth capacitor 35, which has a fixed capacitance, coupled in parallel with a sixth capacitor 36, which has a variable capacitance, between the first port 31 of the second capacitive device Cr2 and the second port 33 of the second capacitive device Cr2. The fourth capacitive element 34 comprises a seventh capacitor 37, which has a fixed capacitance, coupled in parallel with a second capacitor 38, which has a variable capacitance, between the second port 33 of the second capacitive device Cr2 and the first voltage rail 40.

Figure 2:
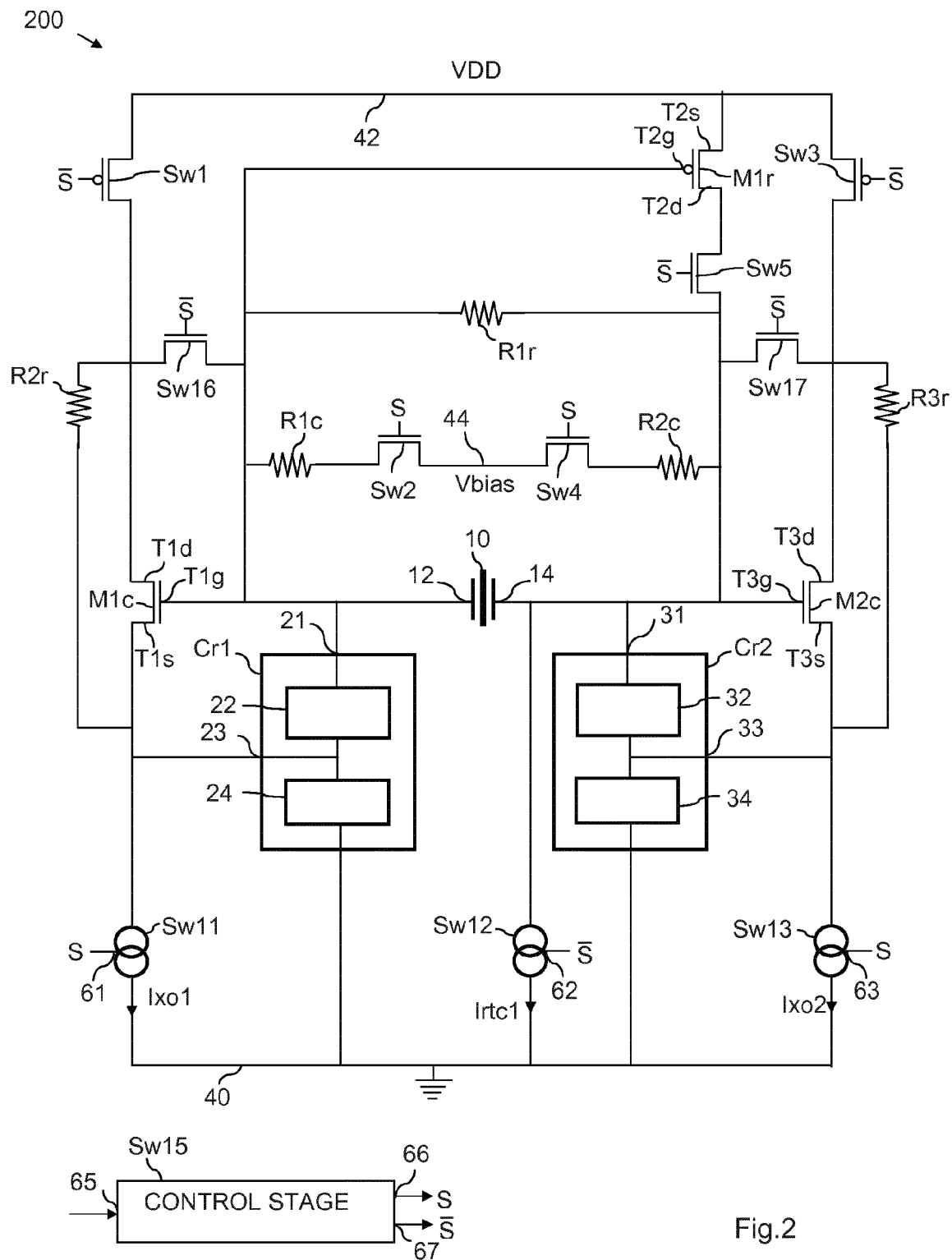
FIG. 2 is a schematic diagram of a first embodiment of an oscillator.

Referring to FIG. 2, an oscillator 200 comprises the inductive device 10 and the first and second capacitive devices Cr1, Cr2 arranged as described with reference to FIG. 1, and therefore forming the tank circuit 100. There is a first transistor M1c, a second transistor M1r, and a third transistor M2c. The second transistor M1r occupies an area of silicon that is smaller than an area of silicon occupied by each of the first and third transistors M1c, M2c.

A switching apparatus Sw1 . . . Sw17 comprises a combination of switch elements referenced Sw1 to Sw10, Sw16 and 17, switchable current sources referenced Sw11 to Sw13, a control stage reference Sw15, and in other embodiments a switchable current source referenced Sw14, for selecting either one of a first oscillator topology and a second oscillator topology. The switch elements referenced Sw1 to Sw10, Sw16 and Sw17, and the switchable current sources referenced Sw11 to Sw13 are controlled by a switching signal S, or an inverse switching signal $\overline{S}$, both of which are generated by the control stage Sw15 in response to an indication of the required topology supplied to an input 65 of the control stage Sw15. In the first oscillator topology, the tank circuit 100 is coupled to the first transistor M1c in a first feedback configuration to provide feedback around the first transistor M1c, whereas in the second oscillator topology, the tank circuit 100 is coupled to the second transistor M1r in a second feedback configuration that is different to the first feedback configuration to provide feedback around the second transistor M1r.

In the first feedback configuration, the first and second capacitive elements 22, 24 constitute a first voltage divider arranged to feed back a proportion of a voltage at a gate T1g of the first transistor M1c to a first terminal T1s of the first transistor M1c and the third and fourth capacitive elements 32, 34 constitute a second voltage divider arranged to feed back a proportion of a voltage at a gate T3g of the third transistor M2c to a first terminal T3s of the third transistor M2c. In the second feedback configuration, the first and second capacitive devices Cr1, Cr2 constitute a third voltage divider arranged to feed back a proportion of a voltage at a first terminal T2d of the second transistor M1r to a gate T2g of the second transistor M1r.

In more detail, a first resistive element R1r is coupled between the first and second ports 12, 14 of the inductive device 10. The first resistive element R1r has a relatively high resistance in order to avoid degrading a quality factor of the tank circuit 100 and consequently increasing the power consumption. The first resistive element R1r may have a resistance of, for example, 200 kΩ. The first port 12 of the inductive device 10 is coupled to the second port 23 of the first capacitive device Cr1 by means of a second resistive element R2r, preferably coupled in series with an eleventh switch element Sw16. The second port 14 of the inductive device 10 is coupled to the second port 33 of the second capacitive device Cr2 by means of a third resistive element R3r, preferably coupled in series with a twelfth switch element Sw17. The second and third resistive elements R2r, R3r, may each have a resistance of, for example, 100 kΩ. The gate T1g of the first transistor M1c is coupled to a first bias voltage rail 44, providing a first bias voltage Vbias, by means of a fourth resistive element R1c coupled in series with a second switch element Sw2, and to the first port 12 of the inductive device 10, and the first terminal T1s of the first transistor M1c is coupled to the second port 23 of the first capacitive device Cr1. The gate T2g of the second transistor M1r is coupled to the first port 12 of the inductive device 10, the first terminal T2d of the second transistor M1r is coupled to the second port 14 of the inductive device 10 by means of a fifth switch element Sw5, and a second terminal T2s of the second transistor device M1r is coupled to a second voltage rail 42. The gate T3g of the third transistor M2c is coupled to the first bias voltage rail 44 by means of a fifth resistive element R2c coupled in series with a fourth switch element Sw4, and to the second port 14 of the inductive device 10, and the first terminal T3s of the third transistor M2c is coupled to the second port 33 of the second capacitive device Cr2. The fourth and fifth resistive elements may each have a resistance of, for example, 10 kΩ.

The switching apparatus Sw1 . . . Sw17 comprises a first switch element Sw1 coupled between a second terminal T1d of the first transistor M1c and the second voltage rail 42, the second switch element Sw2 coupled in series with the fourth resistive element R1c for decoupling the gate T1g of the first transistor M1c from the first bias voltage rail 44, a third switch element Sw3 coupled between a second terminal T3d of the third transistor M2c and the second voltage rail 42, the fourth switch element Sw4 coupled in series with the fifth resistive element R2c for decoupling the gate T3g of the third transistor M2c from the first bias voltage rail 44, and the fifth, eleventh and twelfth switch elements Sw5, Sw16, Sw17. The switching apparatus Sw1 . . . Sw17 also comprises a first switchable current source Sw11 coupled between the second port 23 of the first capacitive device Cr1 and the first voltage rail 40, a second switchable current source Sw12 coupled between the second port 14 of the inductive device 10 and the first voltage rail 40, and a third switchable current source Sw13 coupled between the second port 33 of the second capacitive device Cr2 and the first voltage rail 40.

In operation, the control stage Sw15 generates the switching signal S, which is delivered at a first output 66 of the control stage Sw15, and generates the inverse switching signal $\overline{S}$, which is delivered at a second output 67 of the control stage Sw15. The switching signal S is delivered to the second and fourth switch elements Sw2, Sw4 and to the first and third switchable current sources Sw11, Sw13, and the inverse switching signal $\overline{S}$ is delivered to the first, third, fifth, eleventh and twelfth switch elements Sw1, Sw3, Sw5, Sw16, Sw17 and to the second switchable current source Sw12.

In this way, the switching apparatus Sw1 . . . Sw17, and more specifically the control stage Sw15, is arranged to control the first, second, third, fourth, fifth, eleventh and twelfth switch elements Sw1, Sw2, Sw3, Sw4, Sw5, Sw16, Sw17 and the first, second and third switchable current sources Sw11, Sw12, Sw13 such that, when the first oscillator topology is selected, the first, second, third and fourth switch elements Sw1, Sw2, Sw3, Sw4 each have a relatively low impedance state, the fifth, eleventh and twelfth switch elements Sw5, Sw16, Sw17 each have a relatively high impedance state, the first switchable current source Sw11 sources a first current Ixo1, the second switchable current source Sw12 is switched off, and the third switchable current source Sw13 sources a second current Ixo2. Conversely, when the second oscillator topology is selected, the first, second, third and fourth switch elements Sw1, Sw2, Sw3, Sw4 each have a relatively high impedance state, the fifth, eleventh and twelfth switch elements Sw5, Sw16, Sw17 each have a relatively low impedance state, the first and third switchable current sources Sw11, Sw13 are each switched of and have a relatively high impedance state, and the second switchable current source Sw12 sources a third current Irtc1.

When the first oscillator topology is selected, the oscillator 200 operates as a Colpitts oscillator, using an architecture of a Colpitts oscillator, and can have a relatively low noise and a relatively high power consumption. Using the first oscillator topology, the oscillator 200 generates a differential signal, which is delivered at the first and second ports 12, 14 of the inductive device 10. When the second oscillator topology is selected, the oscillator 200 operates as a Pierce oscillator, using an architecture of a Pierce oscillator, and can have a relatively high noise and a relatively low power consumption. Using the second oscillator topology, the oscillator 200 generates a non-differential signal, rather than a differential signal, which can contribute to reduced power consumption. The non-differential signal is delivered at the second port 14 of the inductive element 10.

The relatively low power consumption when using the second oscillator topology is provided, at least in part, by reducing, relative to the first oscillator topology, the load capacitance experienced by the inductive element 10. This reduction in load capacitance is provided by changing the feedback configuration, that is, switching from the first oscillator topology in which the tank circuit 100 is coupled to the first transistor M1c in a first feedback configuration providing feedback around the first transistor M1c, to the second oscillator topology in which the tank circuit 100 is coupled to the second transistor M1r in a second feedback configuration that is different to the first feedback configuration, providing feedback around the second transistor M1r. For the embodiment described with reference to FIG. 2, in the first oscillator topology the tank circuit 100 is also coupled to the third transistor M2c in the first feedback configuration, providing feedback around the second transistor M2c.

Figure 3:
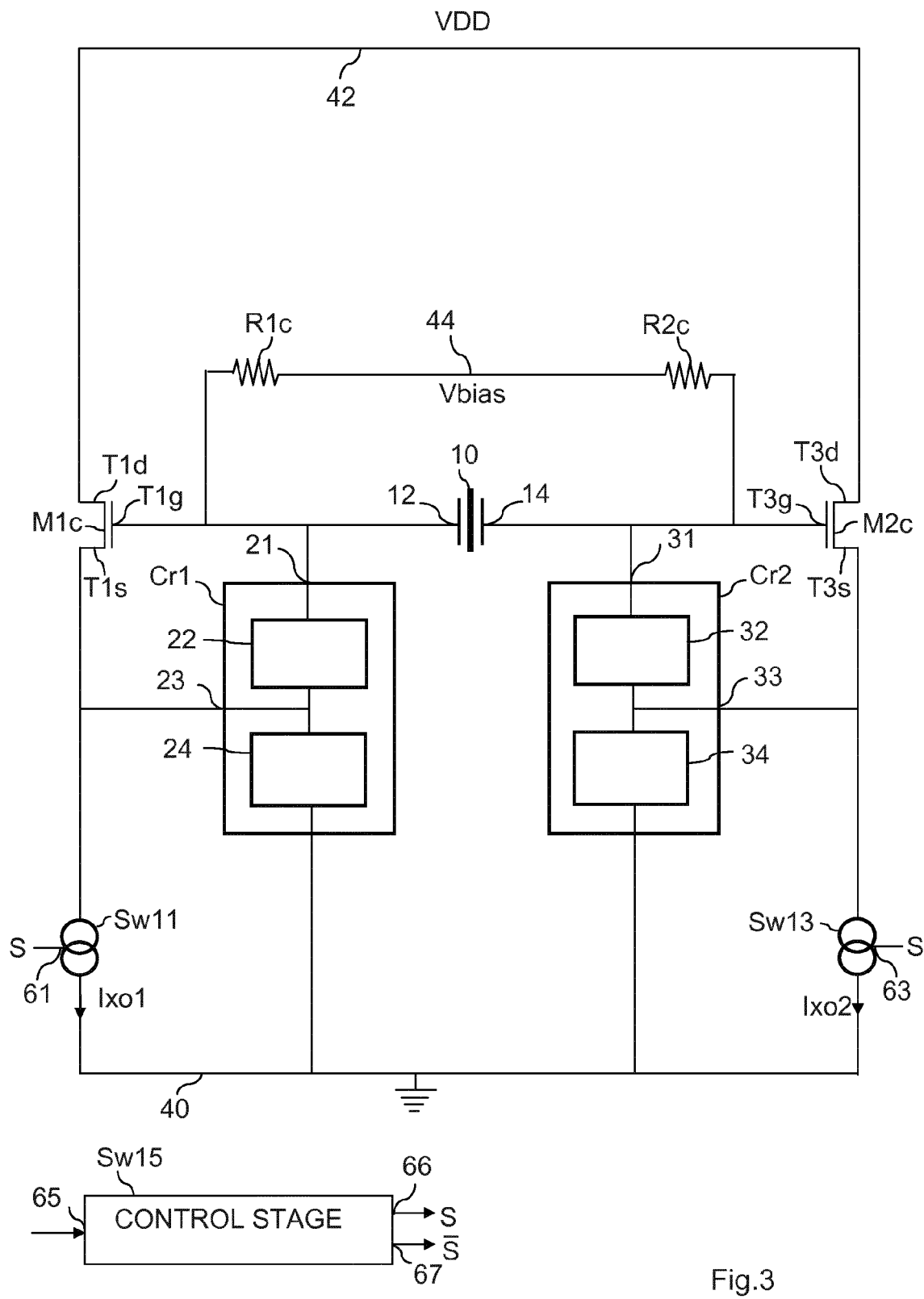
FIG. 3 is an equivalent circuit of the first embodiment of an oscillator with a first oscillator topology selected.

An equivalent circuit of the oscillator 200 when the first oscillator topology is selected is illustrated in FIG. 3. Elements illustrated in FIG. 2 and which do not contribute to the architecture of the Colpitts oscillator, due to being disabled by the switching apparatus Sw1-Sw17 providing an open circuit, or high impedance state, are not shown in FIG. 3. In particular, the second transistor M1r is not shown in FIG. 3 as it is not biased and therefore is in a non-conducting state due to the open circuit, or high impedance state, provided by the fifth switch element Sw5 and because the second switchable current source Sw12 is switched off and has a high impedance. Likewise, the second switchable current source Sw12 is not shown in FIG. 3 as it is switched off and has a relatively high impedance state. In addition, those of the switch elements Sw1-Sw10, Sw16, Sw17 that have a relatively low impedance state when the first oscillator topology is selected are replaced in FIG. 3 by a short circuit, and those of the switch elements Sw1-Sw10, Sw16, Sw17 that have a relatively high impedance state when the first oscillator topology is selected are replaced in FIG. 3 by an open circuit. The second and third resistive elements R2r, R3r are not shown in FIG. 3 as they are decoupled from the inductive device 10 by the eleventh and twelfth switch elements Sw16, Sw17. FIG. 3 is applicable also to the optional variant where the eleventh and twelfth switch elements Sw16, Sw17 are omitted, being instead replaced by a short circuit, where the second and third resistive elements R2r, R3r have a high resistance and have negligible influence on the operation of the oscillator 200 when the first topology is selected.

In the case that the inductive device 10 is a quartz crystal, the quartz crystal may resonate at its fundamental frequency and in an anti-resonance mode.

When the first oscillator topology is selected, such that the oscillator 200 operates with the architecture of a Colpitts oscillator, the first and third transistor M1c, M2c form an amplifier that sustain oscillation by means of feedback applied by the tank circuit 100 to the first and third transistors M1c, M2c in the first feedback configuration. In the first feedback configuration, the proportion of the voltage at the gate T1g of the first transistor M1c which is fed back to the first terminal T1s of the first transistor M1c by the first voltage divider formed by the first and second capacitive elements 22, 24 is Cc/(Cc+Cf), where Cc is the capacitance of the first capacitive element 22 and Cf is the capacitance of the second capacitive element 24. Similarly, the third and fourth capacitive elements 32, 34 can also have the capacitance Cc and Cf respectively, in which case the proportion of the voltage at the gate T3g of the third transistor M2c which is fed back to the first terminal T3s of the third transistor M2c by the second voltage divider formed by the third and fourth capacitive elements 32, 34 is Cc/(Cc+Cf). The capacitive load seen by the inductive device 10, when the first oscillator topology is selected, is Cc.Cf/[2.(Cc+Cf)]

Figure 4:
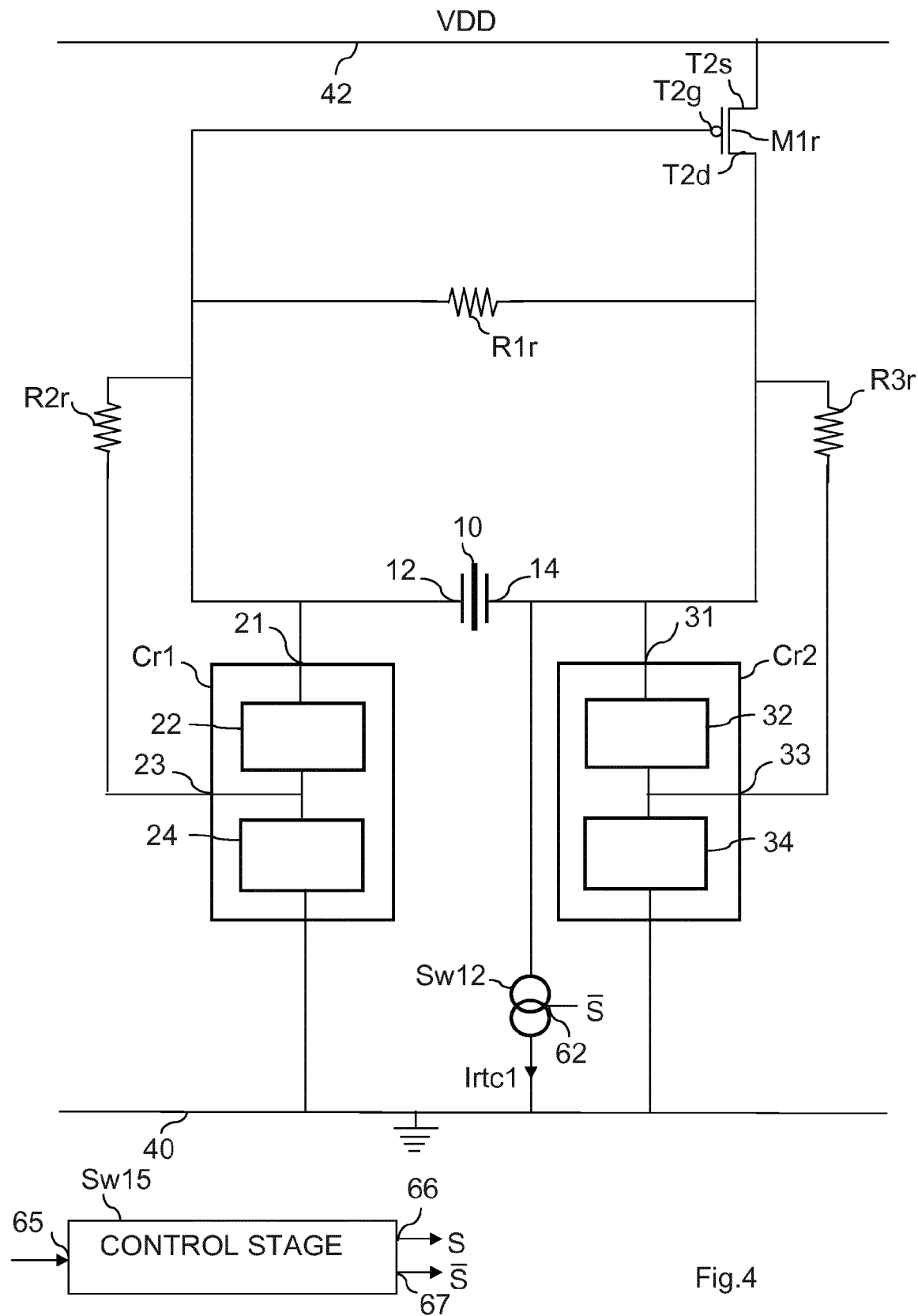
FIG. 4 is an equivalent circuit of the first embodiment of an oscillator with a second oscillator topology selected.

An equivalent circuit of the oscillator 200 when the second oscillator topology is selected is illustrated in FIG. 4. Elements illustrated in FIG. 2 and which do not contribute to the architecture of the Pierce oscillator, due to being disabled by the switching apparatus Sw1-Sw17 providing an open circuit, are not shown in FIG. 4. In particular, the first and third transistors M1c, M2c are not shown in FIG. 4 as they are not biased and therefore are in a non-conducting state due to the relatively high impedance, or open circuit, provided by the first and third switch elements Sw1, Sw3 and because the first and third switchable current sources Sw11, Sw13 each have a relatively high impedance state. Similarly, the fourth and fifth resistive elements R1c, R2c are not shown in FIG. 4 as they cannot conduct current due to the relatively high impedance, or open circuit provided by the second and fourth switch elements Sw2, Sw4. The fourth and fifth resistive elements R1c, R2c have a relatively low impedance and, if permitted to conduct current when the second oscillator topology is selected, would cause a loss of energy from the tank circuit 100. In addition, those of the switch elements Sw1-Sw10, Sw16, Sw17 that have a relatively low impedance state, or a short circuit, when the second oscillator topology is selected are replaced in FIG. 4 by a short circuit, and those of the switch elements Sw1-Sw10, Sw16, Sw17 that have a relatively high impedance state, or open circuit, when the second oscillator topology is selected are replaced in FIG. 4 by an open circuit. The second and third resistive elements R2r, R3r preferably have a high resistance in order to avoid degrading the quality factor of the tank circuit 100.

When the second oscillator topology of the oscillator 200 is selected, such that the oscillator 200 operates with the architecture of a Pierce oscillator, a single transistor, specifically the second transistor M1r, provides amplification that sustains oscillation by means of feedback applied by the tank circuit 100 to the second transistor in the second feedback configuration. In the second feedback configuration, the first and second capacitive devices Cr1, Cr2 constitute a voltage divider arranged to feed back a proportion of a voltage at a first terminal T2d of the second transistor M1r to a gate T2g of the second transistor M1r. The capacitive load seen by the inductive device 10 is Cc.Cf/[2.(Cc+Cf)]. Making the capacitance of the first and second capacitive devices Cr1, Cr2 equal can give a good trade-off between power consumption and frequency stability. However, because, in this embodiment, the oscillator 200 is not required to generate a differential signal when the second oscillator topology is selected, the capacitance of the first and second capacitive devices Cr1, Cr2 need not be equal, and so the capacitance of the second, fourth, sixth and eighth capacitors 26, 28, 36, 38 can be controlled independently. This can enable further reduction of power consumption. Moreover, the capacitance of the second, fourth, sixth and eighth capacitors 26, 28, 36, 38, which are variable, need not be maintained constant when switching between the first and second oscillator topologies.

In one example of the oscillator 200 illustrated in FIG. 2, the first and fifth capacitors 25, 35 can each have a capacitance of 7.5 pF, the second and sixth capacitors 26, 36 can each have a capacitance variable between 0 and 50 pF and, the third and seventh capacitors 27, 37 can each have a capacitance of 10 pF, and the fourth and eighth capacitors 28, 38 can each have a capacitance variable between 10 pF and 50 pF. The first, second, fifth and sixth capacitors 25, 26, 35, 36 can determine a frequency of oscillation coarsely, and the third, fourth, seventh and eighth capacitors 27, 28, 37, 38 can determine a frequency of oscillation finely.

Figure 5:
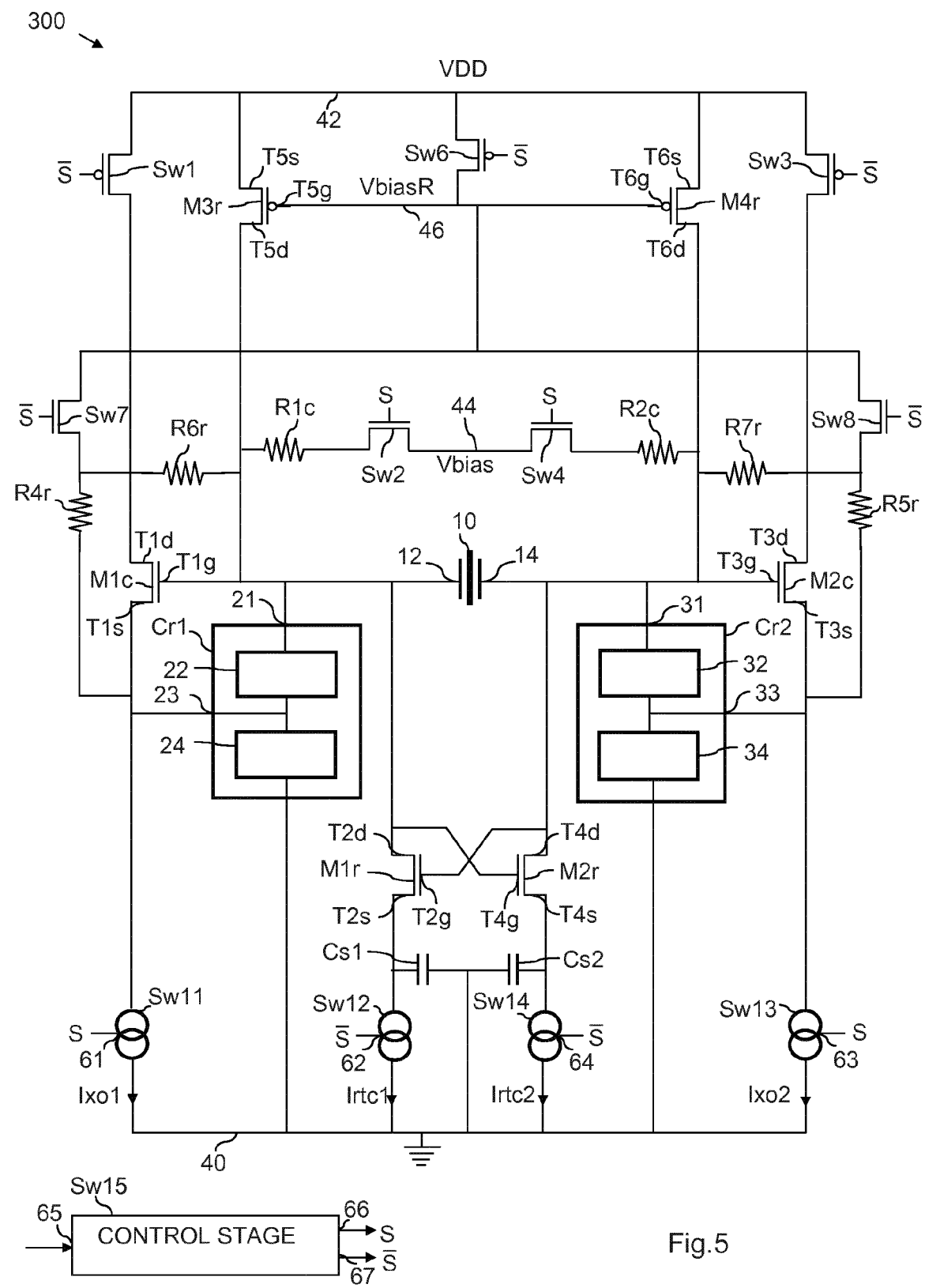
FIG. 5 is a schematic diagram of a second embodiment of an oscillator.

Referring to FIG. 5, which illustrates a second embodiment of an oscillator, the oscillator 300 comprises the inductive device 10 and the first and second capacitive devices Cr1, Cr2 arranged as described with reference to FIG. 1, and therefore forming the tank circuit 100. It also comprises the first transistor M1c, the second transistor M1r, and the third transistor M2c. In particular, the second transistor M1r is arranged differently than in the first embodiment described with reference to FIG. 2. As for the embodiment described with reference to FIG. 2, the second transistor M1r occupies an area of silicon that is smaller than an area of silicon occupied by each of the first and third transistors M1c, M2c.

The oscillator 300 also comprises the switching apparatus Sw1 . . . Sw17 comprising the combination of first to eighth switch elements referenced Sw1 to Sw8, excluding the fifth switch element Sw5, and comprises the switchable current sources referenced Sw11 to Sw14, and the control stage reference Sw15 for selecting either one of a first oscillator topology and a second oscillator topology. The first to eighth switch elements Sw1 to Sw8, excluding the fifth switch element Sw5, and the switchable current sources referenced Sw11 to Sw14 are controlled by the switching signal S, or the inverse switching signal $\overline{S}$, both of which are generated by the control stage Sw15 in response to an indication of the required topology supplied to the input 65 of the control stage Sw15. In the first oscillator topology, the tank circuit 100 is coupled to the first transistor M1c in a first feedback configuration to provide feedback around the first transistor M1c, whereas in the second oscillator topology, the tank circuit 100 is coupled to the second transistor M1r in a second feedback configuration that is different to the first feedback configuration to provide feedback around the second transistor M1r.

As for the embodiment described with reference to FIG. 2, in the first feedback configuration, the first and second capacitive elements 22, 24 constitute a first voltage divider arranged to feed back a proportion of a voltage at a gate T1g of the first transistor M1c to a first terminal T1s of the first transistor M1c and the third and fourth capacitive elements 32, 34 constitute a second voltage divider arranged to feed back a proportion of a voltage at a gate T3g of the third transistor M2c to a first terminal T3s of the third transistor M2c. In the second feedback configuration, the first and second capacitive devices Cr1, Cr2 constitute a capacitive load in parallel to the inductive device 10. Negative feedback needed to sustain oscillation is provided by cross-coupling between the second transistor M1r and the fourth transistor M2r. The oscillation may occur in one of two different oscillation modes, depending on the value of the fifth and sixth capacitive elements Cs1, Cs2. In a first oscillation mode, the oscillation occurs around a resonator made up by the inductive device 10 and the first and second capacitive devices Cr1, Cr2. In the second oscillation mode, the inductive device 10 is not used and the first and second capacitive devices Cr1, Cr2 operate in a relaxation mode. The capacitance of the fifth and sixth capacitive elements Cs1, Cs2 is selected to force the oscillator 300 to operate only in the first oscillation mode.

In more detail, the gate T1g of the first transistor M1c is coupled to the first bias voltage rail 44 by means of the fourth resistive element R1c, to a second bias voltage rail 46 by means of a sixth resistive element R6c, and to the first port 12 of the inductive device 10, and the first terminal T1s of the first transistor M1c is coupled to the second port 23 of the first capacitive device Cr1. The first terminal T2d of the second transistor M1r is coupled to the first port 12 of the inductive device 10 and the second terminal T2s of the second transistor M1r is coupled to the first voltage rail 40 by means of a fifth capacitive element Cs1. The gate T3g of the third transistor M2c is coupled to the first bias voltage rail 44 by means of the fifth resistive element R2c, to the second bias voltage rail (46) by means of a seventh resistive element (R7r), and to the second port 14 of the inductive device 10, and the first terminal T3s of the third transistor M2c is coupled to the second port 33 of the second capacitive device Cr2.

The fourth transistor M2r has a first terminal T4d coupled to the second port 14 of the inductive device 10 and a second terminal T4s coupled to the first voltage rail 40 by means of a sixth capacitive element Cs2. Therefore, the fifth and sixth capacitive elements Cs1, Cs2 are coupled together as they are both coupled to the first voltage rail 40. A gate T4g of the fourth transistor M2r is coupled to the first terminal T2d of the second transistor M1r and the first terminal T4d of the fourth transistor M2r is coupled to the gate T2g of the second transistor M1r. A fifth transistor M3r has a first terminal T5d coupled to the first port 12 of the inductive device 10, a second terminal T5s coupled to the second voltage rail 42. The gate T5g of the fifth transistor M3r is coupled to the second bias voltage rail 46 providing a second bias voltage VbiasR. A sixth transistor M4r has first terminal T6d coupled to the second port 14 of the inductive device 10, and a second terminal T6s coupled to the second voltage rail 42. The gate T6g of the sixth transistor M4r is coupled to the second bias voltage rail 46.

The second port 23 of the first capacitive device Cr1 is coupled to the second bias voltage rail 46 by means of an eighth resistive element R4r, and the second port 33 of the second capacitive device Cr2 is coupled to the second bias voltage rail 46 by means of a ninth resistive element R5r.

The switching apparatus Sw1 . . . Sw17 comprises the first switch element Sw1 coupled between the second terminal T1d of the first transistor M1c and the second voltage rail 42, the second switch element Sw2 coupled in series with the fourth resistive element R1c for decoupling the gate T1g of the first transistor M1c from the first bias voltage rail 44, the third switch element Sw3 coupled between the second terminal T3d of the third transistor M2c and the second voltage rail 42, the fourth switch element Sw4 coupled in series with the fifth resistive element R2c for decoupling the gate T3g of the third transistor M2c from the first bias voltage rail 44, a sixth switch element Sw6 coupling the gate T5g of the fifth transistor M3r and the gate T6g of the sixth transistor M4r to the second voltage rail 42, a seventh switch element Sw7 coupling the sixth and eighth resistive elements R6r, R4r to the second bias voltage rail 46, and arranged for decoupling the second port 23 of the first capacitive device Cr1 and the gate T1g of the first transistor M1c from the bias voltage rail 46, and an eighth switch element Sw8 coupling the seventh and ninth resistive elements R7r, R5r to the second bias voltage rail 46, and arranged for decoupling the second port 33 of the second capacitive device Cr2 and the gate T3g of the third transistor M2c from the second bias voltage rail 46.

There is also the first switchable current source Sw11 coupled between the second port 23 of the first capacitive device Cr1 and the first voltage rail 40, the second switchable current source Sw12 coupled between the second terminal T2s of the second transistor M1r and the first voltage rail 40, the third switchable current source Sw13 coupled between the second port 33 of the second capacitive device Cr2 and the first voltage rail 40, and a fourth switchable current source Sw14 coupled between the second terminal T4s of the fourth transistor M2r and the first voltage rail 40.

In operation, the control stage Sw15 generates the switching signal S, which is delivered at the first output 66 of the control stage Sw15, and generates the inverse switching signal $\overline{S}$, which is delivered at the second output 67 of the control stage Sw15. The switching signal S is delivered to the second and fourth switch elements Sw2, Sw4 and to the first and third switchable current sources Sw11, Sw13, and the inverse switching signal $\overline{S}$ is delivered to the first, third, sixth, seventh and eighth switch elements Sw1, Sw3, Sw6, Sw7, Sw8 and to the second and fourth switchable current sources Sw12, Sw14.

In this way, the switching apparatus Sw1 . . . Sw17, and more specifically the control stage Sw15, is arranged to control the first, second, third, fourth, sixth, seventh and eighth switch elements Sw1, Sw2, Sw3, Sw4, Sw6, Sw7, Sw8 and the first, second third and fourth switchable current sources Sw11, Sw12, Sw13, Sw14 such that, when the first oscillator topology is selected, the first, third, sixth, seventh and eighth switch elements Sw1, Sw3, Sw6, Sw7, Sw8 each have a relatively low impedance state, the second and fourth switch elements Sw2, Sw4 each have a relatively high impedance state, the first switchable current source Sw11 sources a first current Ixo1, the third switchable current source Sw13 sources a second current Ixo2, and the second and fourth switchable current sources Sw12, Sw14 are each switched off, having a relatively high impedance. Conversely, when the second oscillator topology is selected, the first, third, sixth, seventh and eighth switch elements Sw1, Sw3, Sw6, Sw7, Sw8 each have a relatively high impedance state, the second and fourth switch elements Sw2, Sw4 each have a relatively low impedance state, the first and third switchable current sources Sw11, Sw13 are each switched off, the second switchable current source Sw12 sources a third current Irtc1, and the fourth switchable current source Sw14 sources a fourth current Irtc2.

When the first oscillator topology is selected, the oscillator 300 operates as a Colpitts oscillator, using an architecture of a Colpitts oscillator, and can have a relatively low noise and a relatively high power consumption. Using the first oscillator topology, the oscillator 300 generates a differential signal, which is delivered at the first and second ports 12, 14 of the inductive device 10. When the second oscillator topology is selected, the oscillator 300 operates as a relaxation oscillator, using an architecture of a relaxation oscillator, and can have a relatively high noise and a relatively low power consumption. Using the second oscillator topology, the oscillator 300 generates a differential signal.

The relatively low power consumption when using the second oscillator topology is provided, at least in part, by reducing, relative to the first oscillator topology, the load capacitance experienced by the inductive element 10. When the first oscillator topology is selected, the tank circuit 100 is coupled to the first transistor M1c in a first feedback configuration providing feedback around the first transistor M1c, and when the second oscillator topology is selected, the tank circuit 100 is coupled to the second transistor M1r in a second feedback configuration that is different to the first feedback configuration, providing feedback around the second transistor M1r. For the embodiment described with reference to FIG. 5, in the first oscillator topology the tank circuit 100 is also coupled to the third transistor M2c in the first feedback configuration, providing feedback around the second transistor M2c, and in the second oscillator topology the tank circuit 100 is also coupled to the fourth transistor M2r in the second feedback configuration, providing feedback around the fourth transistor M2r.

An equivalent circuit of the oscillator 300 described with reference to FIG. 5, when the first oscillator topology is selected, is similar to the circuit illustrated in FIG. 3. Elements illustrated in FIG. 5 and which do not contribute to the architecture of the Colpitts oscillator, due to being disabled by the switching apparatus Sw1-Sw17 providing an open circuit or a high impedance state, are not shown in FIG. 3. In particular, the second transistor M1r is not shown in FIG. 3 as it is not biased and therefore is in a non-conducting state because the second switchable current source Sw12 is switched of and has a relatively high impedance state. Likewise, the fourth transistor M2r is not shown in FIG. 3 as it is not biased and therefore is in a non-conducting state because the fourth switchable current source Sw14 is switched off and has a relatively high impedance state. The second and fourth switchable current sources Sw12, Sw14 are not shown in FIG. 3 as they are switched off, having a relatively high impedance state. In addition, those of the switch elements Sw1-Sw10 that have a relatively low impedance when the first oscillator topology is selected are replaced in FIG. 3 by a short circuit, and those of the switch elements Sw1-Sw10 that have a relatively high impedance state when the first oscillator topology is selected are replaced in FIG. 3 by an open circuit. In particular, as the sixth switch element Sw6 has a relatively low impedance state, the second bias voltage rail 46 is short-circuited to the second voltage rail 42 and so the fifth and sixth transistors M3r, M4r present an open circuit, that is, are switched off, and are not shown in FIG. 5. When the first oscillator topology is selected, the oscillator 300 illustrated in FIG. 5 operates with the architecture of a Colpitts oscillator, as described above in relation to the oscillator 200 illustrated in FIG. 2.

Figure 6:
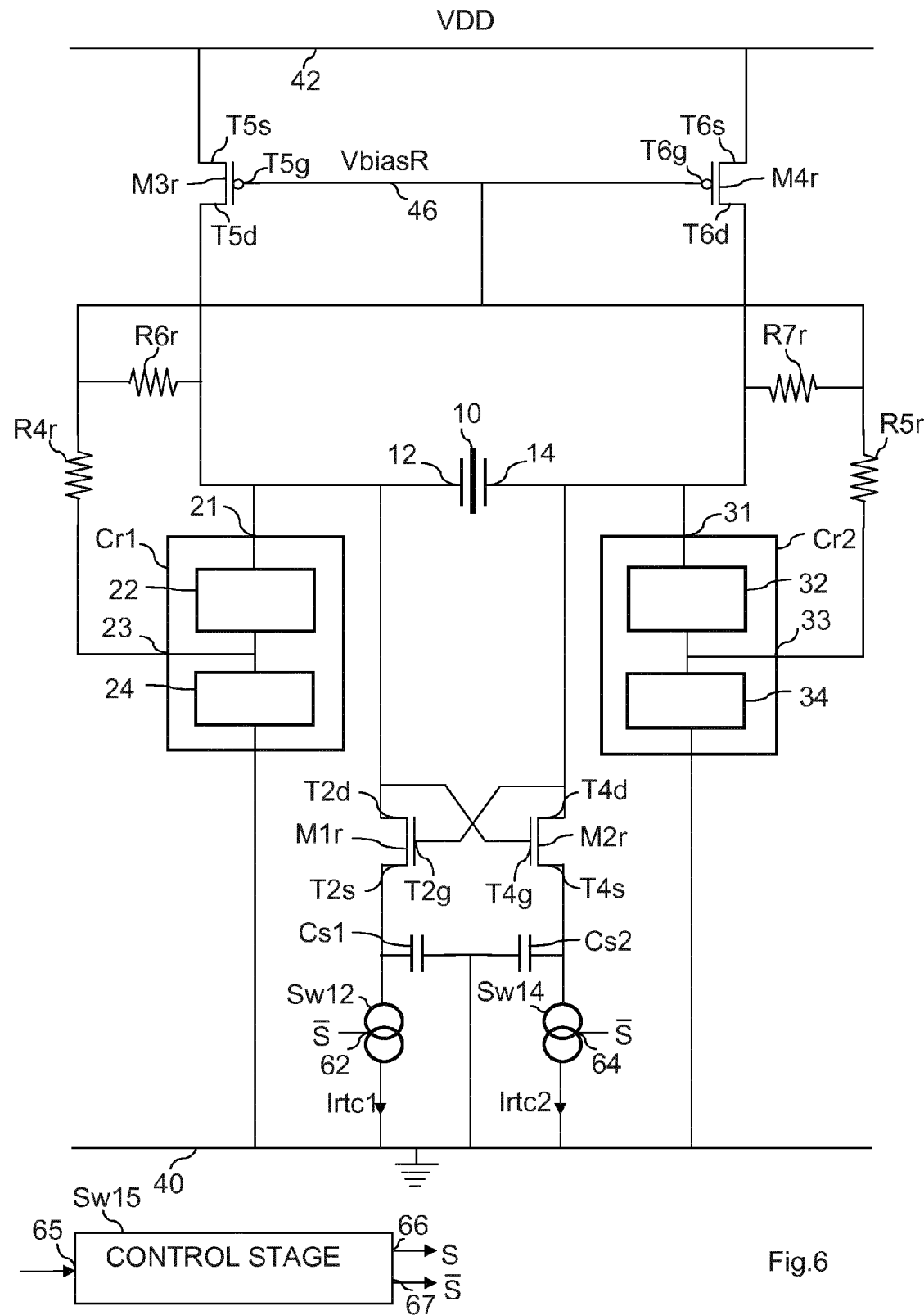
FIG. 6 is an equivalent circuit of the second embodiment of an oscillator with a second oscillator topology selected.

An equivalent circuit of the oscillator 300 of FIG. 5, when the second oscillator topology is selected is illustrated in FIG. 6. Elements illustrated in FIG. 5 and which do not contribute to the architecture of the relaxation oscillator, due to being disabled by the switching apparatus Sw1-Sw17 providing a relatively high impedance state, are not shown in FIG. 6. In particular, the first and third transistors M1c, M2c are not shown in FIG. 6 as they are not biased and therefore are in a non-conducting state due to the relatively high impedance state, or open circuit, provided by the first and third switch elements Sw1, Sw3 and because the first and third switchable current sources Sw11, Sw13 are each switched off, having a relatively high impedance. Similarly, the fourth and fifth resistive elements R1c, R2c are not shown in FIG. 4 as they cannot conduct current due to the relatively high impedance state, or open circuit, provided by the second and fourth switch elements Sw2, Sw4. The fourth and fifth resistive elements R1c, R2c have a relatively low impedance state, which, if permitted to conduct current when the second oscillator topology is selected, would cause a loss of energy from the tank circuit 100. In addition, those of the switch elements Sw1-Sw10 that have a relatively low impedance state when the second oscillator topology is selected are replaced in FIG. 6 by a short circuit, and those of the switch elements Sw1-Sw10 that have a relatively high impedance state when the second oscillator topology is selected are replaced in FIG. 6 by an open circuit. In the circuit illustrated in FIG. 5, the sixth, seventh, eighth and ninth resistive elements R6r, R7r, R4r, R5r are included to ensure that the first and third transistors M1c, M2c are unbiased when the first oscillator topology is selected, by coupling the gate T1g and first terminal T1s of the first transistor M1c, and the gate T3g and first terminal T3s of the third transistor M2c, to the second bias voltage rail 46. The sixth, seventh, eighth and ninth resistive elements R6r, R7r, R4r, R5r preferably have a high resistance in order to avoid degrading the quality factor of the tank circuit 100.

When the second oscillator topology of the oscillator 300 is selected, such that the oscillator 300 operates with the architecture of a relaxation oscillator, the second and fourth transistors M1r, M2r provide amplification that sustains oscillation, and a second feedback configuration is used, which is different from the first feedback configuration used when the first oscillator topology is selected. The first capacitive device Cr1 is coupled between the first port 12 of the inductive device 10, which corresponds to the first terminal T2d of the second transistor M1r, and the first voltage rail 40, and a voltage at the first terminal T2d of the second transistor M1r is fed back to the gate T2g of the second transistor M1r by means of the gate T4g and first terminal T4d of the fourth transistor M2r. The second capacitive device Cr2 is coupled between the second port 14 of the inductive device 10, which corresponds to the first terminal of the fourth transistor M2r, and the first voltage rail, and a voltage at the first terminal T4d of the fourth transistor M2r is fed back to the gate T4g of the fourth transistor M2r by means of the gate T2g and first terminal T2d of the second transistor M1r. The fifth and sixth transistors M3r, M4r impose the same current above and below the second and fourth transistors M1r, M2r respectively.

In one example of the oscillator 300 illustrated in FIG. 5, the first and fifth capacitors 25, 35 can each have a capacitance of 7.5 pF, the second and sixth capacitors 26, 36 can each have a capacitance variable between 0 and 50 pF and, the third and seventh capacitors 27, 37 can each have a capacitance of 10 pF, and the fourth and eighth capacitors 28, 38 can each have a capacitance variable between 10 pF and 50 pF. In conjunction with the inductive device 10, the first, second, fifth and sixth capacitors 25, 26, 35, 36 can determine a frequency of oscillation coarsely, and the third, fourth, seventh and eighth capacitors 27, 28, 37, 38 can determine a frequency of oscillation finely, when the first oscillator topology is selected. A capacitance of the fifth and sixth capacitance elements Cs1, Cs2 is selected to assure the starting of oscillation. When the first oscillator topology is selected, such that the oscillator 300 operates with the architecture of a Colpitts oscillator, the fifth and sixth capacitance elements Cs1, Cs2 have only a second order influence on the total capacitive load applied to the inductive device 10, as the second and fourth transistors M1r, M2r are not biased. Optionally, the fifth and sixth capacitance elements Cs1, Cs2 could be disconnected when the first oscillator topology is selected by adding a further switch element in series with each of them.

Figure 7:
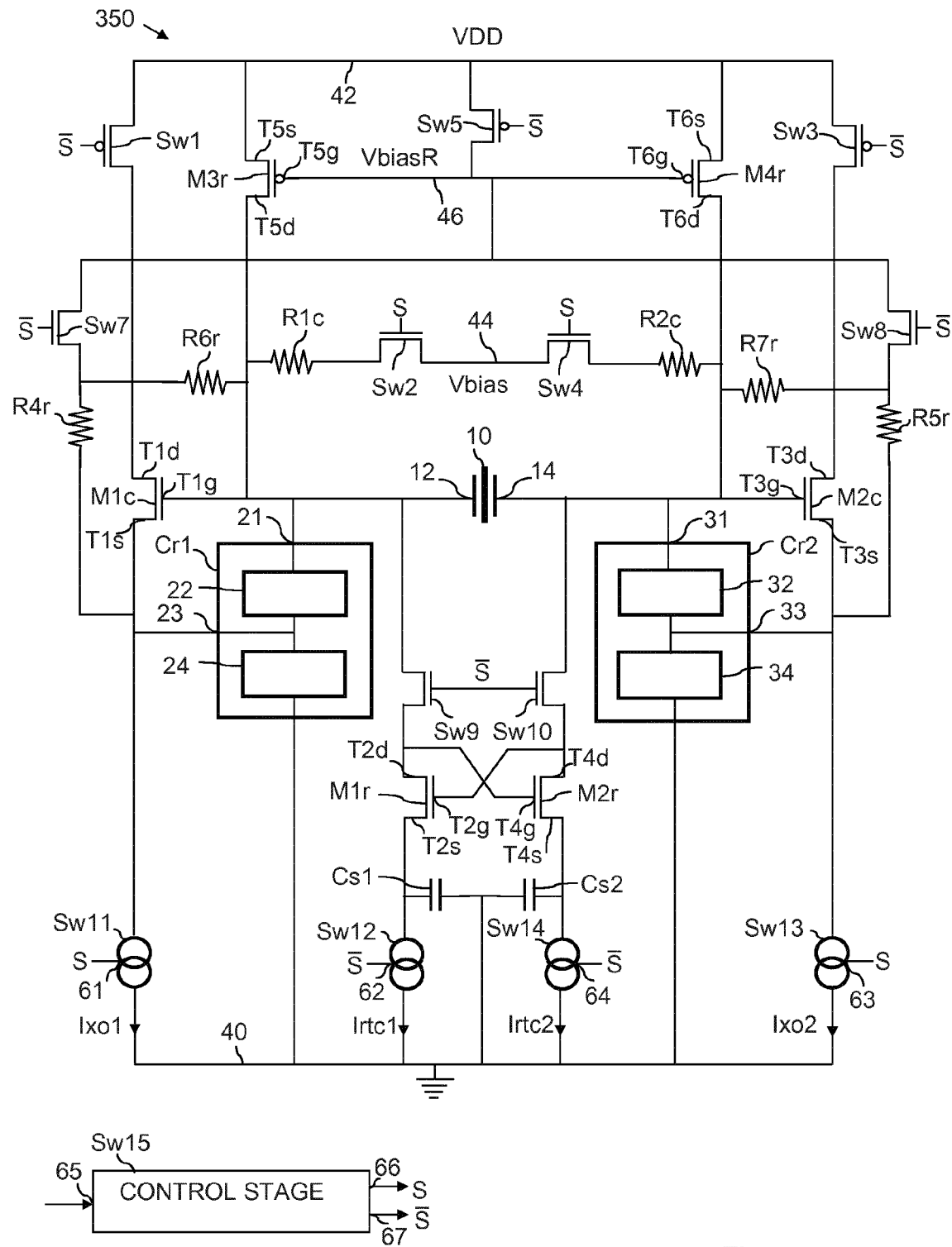
FIG. 7 is a schematic diagram of a variant of the second embodiment of an oscillator.

Referring to FIG. 7, an oscillator 350 is identical to the oscillator 300 described with reference to FIG. 5, except that the switching apparatus Sw1 . . . Sw17 further comprises an ninth switch element Sw9 and a tenth switch element Sw10. The second terminal T2d of the second transistor M1r is coupled to the first port 12 of the inductive device 10 by means of a ninth switch element Sw9, rather than being directly coupled to the first port 12 of the inductive device 10, and the second terminal T4d of the fourth transistor M2r is coupled to the second port 14 of the inductive device 10 by means of a tenth switch element Sw10, rather than being directly coupled to the second port 14 of the inductive device 10. The control stage Sw15 is arranged to control the ninth and tenth switch elements Sw9, Sw10 such that, when the first oscillator topology is selected, the ninth and tenth switch elements Sw9, Sw10 have a relatively high impedance state, and when the second oscillator topology is selected, the eighth and tenth switch elements Sw9, Sw10 have a relatively low impedance state. The ninth and tenth switch elements Sw9, Sw10 are NMOS transistors, and so they are controlled in response to the inverse control signal $\overline{S}$. The inclusion of the ninth switch element Sw9 and a tenth switch element Sw10 can reduce the phase noise when the first oscillator topology is selected by completely disconnecting the second and fourth transistors M1r, M2r from the tank circuit 100, thereby avoiding any remaining currents in the cross-coupled second and fourth transistors M1r, M2r.

Figure 8:
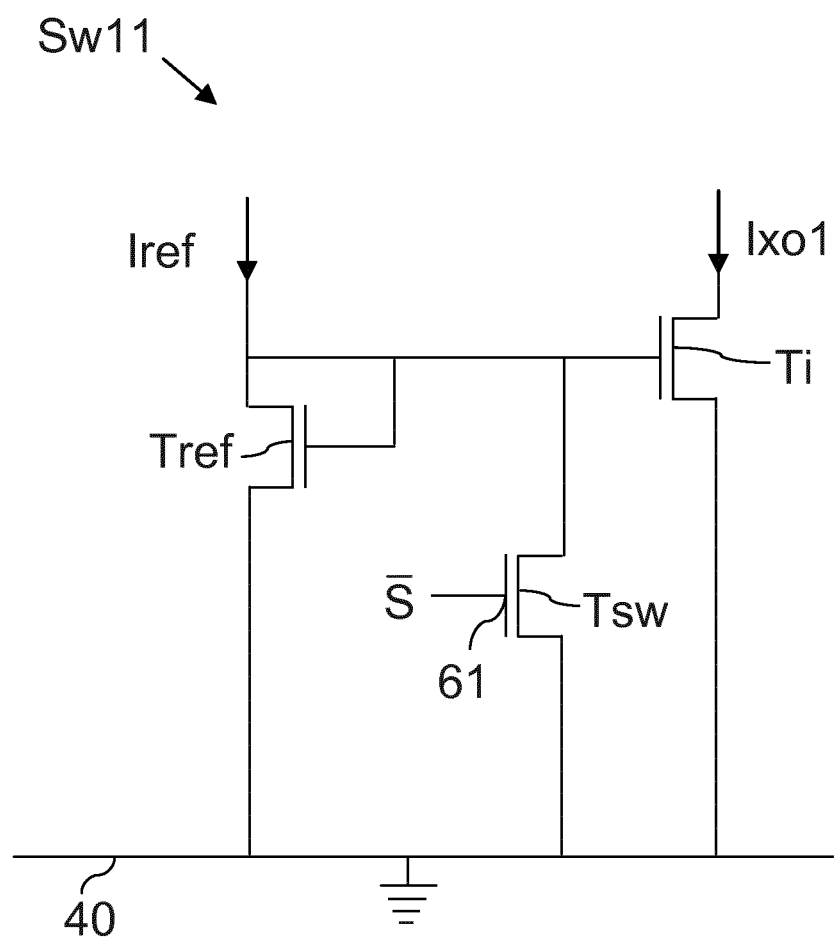
FIG. 8 is a schematic diagram of a switchable current source.

Referring to FIG. 8, an example embodiment of the first switchable current source Sw11 is illustrated, although the second, third and fourth switchable current sources Sw12, Sw13, Sw14 may have an identical structure. A reference current Iref is established by a reference transistor Tref having a drain coupled to a non-illustrated source of current, a source coupled to the first voltage rail 40, and a gate coupled to its drain. The first current Ixo1 is provided at a drain of a current source transistor Ti which has its source coupled to the first voltage rail 40 and its gate coupled to the gate of the reference transistor Tref. For interrupting the flow of the first current Ixo1, and instead presenting an open circuit at the drain of the current switching transistor Ti, a switching transistor Tsw has a drain coupled to the gate of the current switching transistor Ti, a source coupled to the first voltage rail 40, and is controlled responsive to the inverse control signal $\overline{S}$ applied to its gate.

Figure 9:
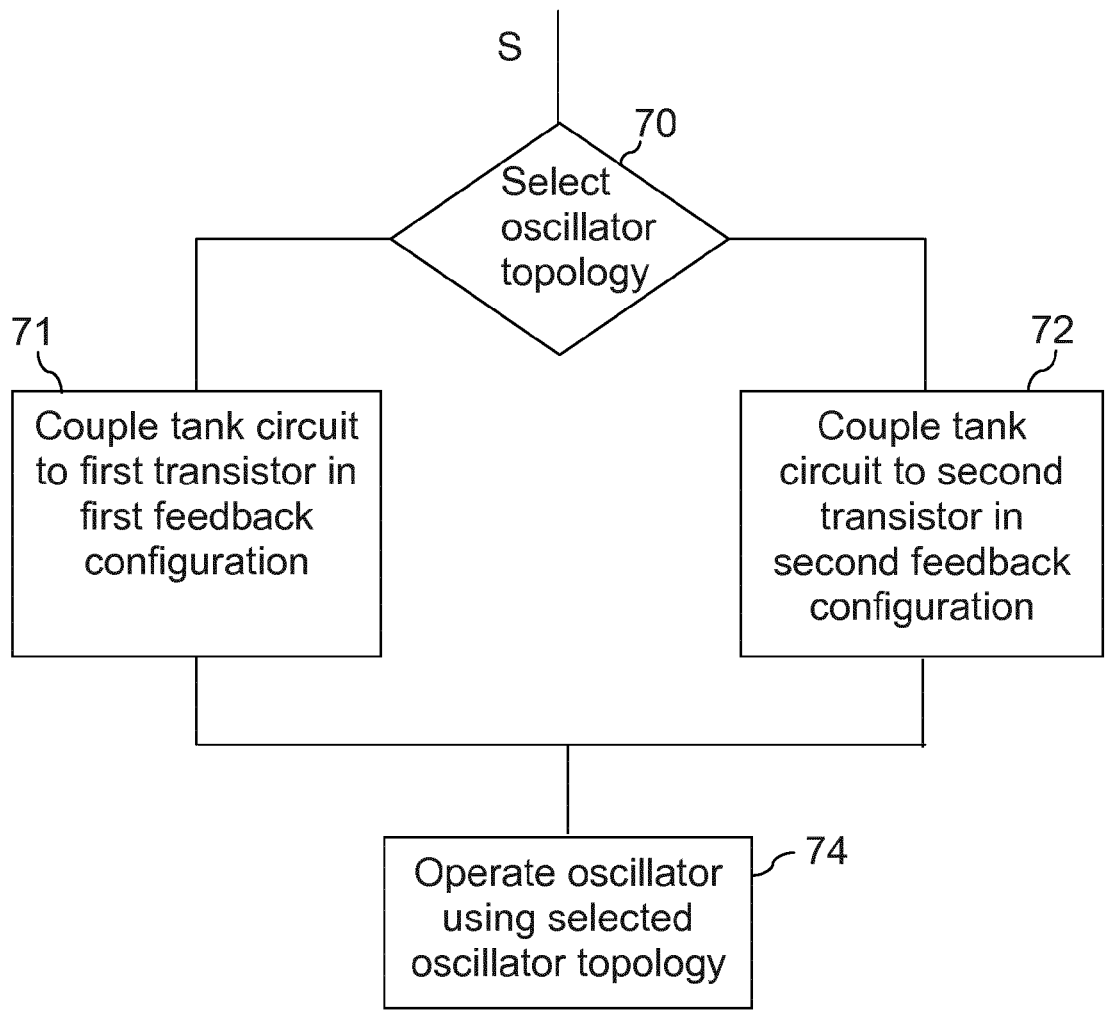
FIG. 9 is a flow chart of a method of operating an oscillator.

Referring to FIG. 9, there is illustrated a method of operating an oscillator comprising the tank circuit 100, the first transistor M1c and the second transistor M1r, where the second transistor M1r occupies an area of silicon that is smaller than an area of silicon occupied by the first transistor M1c. The method is therefore applicable to the embodiments of the oscillators 200, 300, 350 described with reference to FIGS. 2, 5 and 7. The method commences at step 70 by selecting either one of the first oscillator topology and the second oscillator topology, which may be in response to the control signal S. If the first oscillator topology is selected, flow proceeds to step 71 where the tank circuit 100 is coupled to the first transistor M1c in a first feedback configuration to provide feedback around the first transistor M1c. Flow then proceeds to step 74 where the oscillator 200 is operated using the selected first oscillator topology. If, at step 70, the second oscillator topology is selected, flow proceeds to step 72 where the tank circuit 100 is coupled to the second transistor M1r in a second feedback configuration, that is different to the first feedback configuration, to provide feedback around the second transistor M1r. Flow then proceeds to step 74 where the oscillator 200, 300 or 350 is operated using the selected second oscillator topology.

Figure 10:
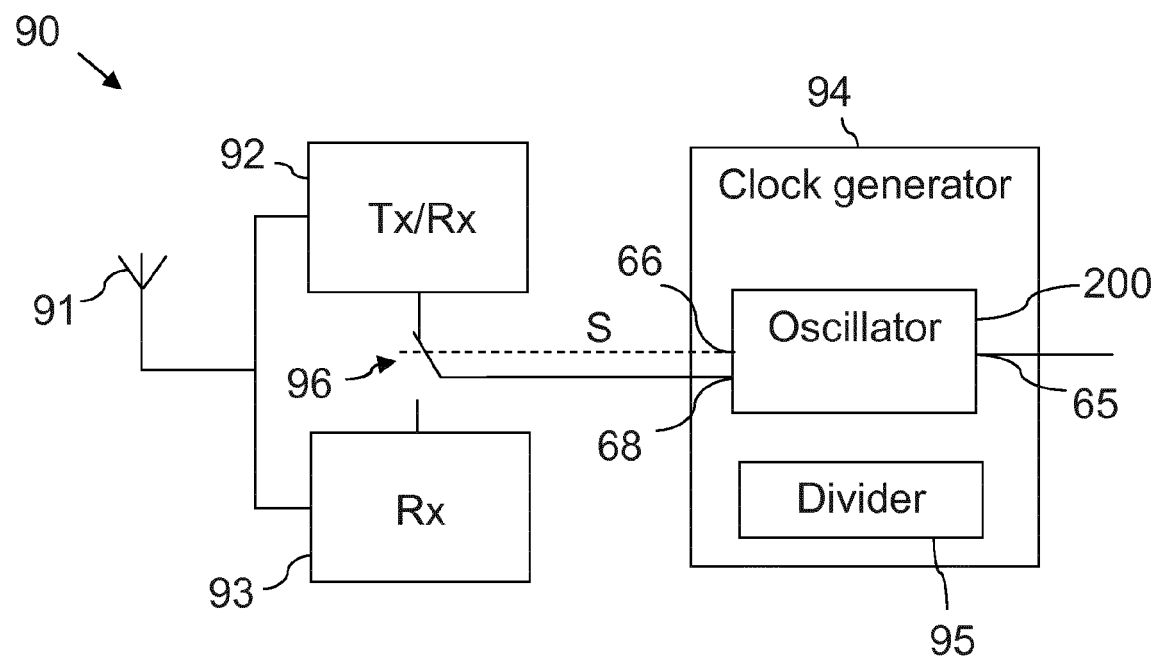
FIG. 10 is a block schematic diagram of an electronic apparatus.

Referring to FIG. 10, an electronic apparatus 90, which in this example is a wireless communication apparatus, comprises an antenna 91 coupled to a transceiver 92, for delivering communication signals detected by the antenna for reception and for emitting communication signals delivered from the transceiver 92 for transmission, and to a receiver 93 for processing broadcast signals detected by the antenna 91. A clock generator 94 generates a first clock signal required by the transceiver 92, for example for digital processing of a baseband signal, for up-conversion of the baseband signal to a radio frequency and for down-conversion of a radio frequency signal to baseband, and generates a second clock signal required by the receiver 93, for example for down-conversion of a radio frequency signal to baseband and for digital processing of a baseband signal. The clock generator 94 comprises the oscillator 200, or any other of the embodiments of the oscillator disclosed herein, for generating the first and second clock signals, and may also comprises a divider 95 for establishing desired frequencies of the first and second clock signals. The electronic apparatus 90 either transmits and receives radio frequency communication signals or receives broadcast signals, dependent on an indication at the input 65 of the control stage Sw15 of the oscillator 200. The required first or second clock signal is delivered at an output 68 of the oscillator 200 and is routed to either the transceiver 92 or the receiver 93, dependent on a routing switch 96. The routing switch 96 is controlled responsive to the control signal S delivered at the first output 66 of the control stage Sw15 of the oscillator 200.

In the embodiment illustrated in FIG. 2 the first and third transistors M1c, M2c are n-channel metal oxide semiconductor field effect transistors (NMOS FETs), and their respective first terminals T1s, T3s are source terminals of the NMOS FETs, and their respective second terminals T1d, T3d are drain terminals of the NMOS FETs. The second transistor M1r is p-channel metal oxide semiconductor field effect transistor (PMOS FET), and its first terminal T2d is a drain terminal and its second terminal T2s is a source terminal. In other, non-illustrated embodiments the type of transistor, that is, NMOS or PMOS may be different, in which case the type of first and second terminal, that is, source or drain, of the transistors may be swapped.

The first to twelfth switch elements Sw1-Sw10, Sw16, Sw17 may be provided by means of either an NMOS or a PMOS transistor, and are not restricted to the types of transistor illustrated in the accompanying drawings. Where an NMOS transistor is employed for one of the first to twelfth switch elements Sw1-Sw10, Sw16, Sw17, and is required to have a relatively low impedance state when the first oscillator topology is selected and a relatively high impedance state when the second oscillator topology is selected, the NMOS transistor can be controlled responsive to the control signal S, where S is a binary signal having a relatively high voltage level when the first oscillator topology is selected and a relatively low voltage level when the second oscillator topology is selected. Conversely, where an NMOS transistor is employed for one of the first to twelfth switch elements Sw1-Sw10, Sw16, Sw17, and is required to have a relatively high impedance state when the first oscillator topology is selected and a relatively low impedance state when the second oscillator topology is selected, the NMOS transistor can be controlled responsive to the inverse control signal $\overline{S}$, where $\overline{S}$ is a binary signal having a relatively low voltage level when the first oscillator topology is selected and a relatively high voltage level when the second oscillator topology is selected. Similarly, where a PMOS transistor is employed for one of the first to twelfth switch elements Sw1-Sw1, Sw16, Sw17, and is required to have a relatively low impedance state when the first oscillator topology is selected and a relatively high impedance state when the second oscillator topology is selected, the PMOS transistor can be controlled responsive to the inverse control signal S. Where a PMOS transistor is employed for one of the first to twelfth switch elements Sw1-Sw10, Sw16, Sw17, and is required to have a relatively high impedance state when the first oscillator topology is selected and a relatively low impedance state when the second oscillator topology is selected, the PMOS transistor can be controlled responsive to the control signal S. Furthermore, the skilled person will readily recognise that the switching transistor Tsw of the switchable current source described with reference to FIG. 8, can be either an NMOS or a PMOS transistor, and the appropriate control signal S or inverse control signal $\overline{S}$ may be selected in order to provide the functionality of sourcing a current or of an open circuit as described herein.

For clarity, elements for biasing, amplitude control and output buffering not essential to the understanding of the disclosure have been omitted from FIGS. 2 to 7.

The oscillators 200, 300, 350 described with reference to FIGS. 2, 5 and 7 may have an operating frequency that is the same for both the first and second oscillator topology. Alternatively, the operating frequency may be different for the first and second oscillator topologies. In particular, the second oscillator topology may provide an operating frequency that is lower than an operating frequency provided by the first oscillator topology. For example, with the first oscillator topology selected, the operating frequency may be 26 MHz, 38.4 MHz or 52 MHz, and with the second oscillator topology selected, the operating frequency may be the same, but the oscillator signal may subsequently be divided to 32 kHz. The currents required by the oscillator 200, 300, 350 can be typically 900 µA for the first oscillator topology, 5 µA to 10 µA for the second oscillator topology using the embodiment described with reference to FIG. 2 which generates a non-differential signal, and 30 µA for the second oscillator topology using the embodiment described with reference to FIG. 5 which generates a differential signal.

The capacitance of one or more of the first, second, third and fourth capacitive elements 22, 24, 32, 34 may be adjusted under the control of the control stage Sw15 by adjusting the capacitance of one or more of the second, fourth, sixth and eighth capacitors 26, 28, 36, 38, which have a variable capacitance. In particular, the operating frequency may be tuned by adjusting the capacitance when any of the oscillators 200, 300, 350 are switched between the first oscillator topology and the second oscillator topology. Also, when switching to the Pierce architecture, at least one of the second, fourth, sixth and eighth capacitors 26, 28, 36, 38 may have its capacitance changed to ensure that the first and second capacitive devices Cr1, Cr2 do not have an equal capacitance, which is a requirement for the Pierce architecture.

Although embodiments have been described which employ NMOS and PMOS transistors, alternatively other types of transistor may be employed, in particular bipolar transistors.

FIGS. 11 to 16 describe a practical implementation of a dual core oscillator, but they do not show, for the sake of simplicity, some auxiliary functions that would be needed in a real-world implementation and are usual in oscillators, namely the biasing, the amplitude control and the output buffering. However the biasing and the switching circuitry directly related to the embodiments are described.

Figure 11:
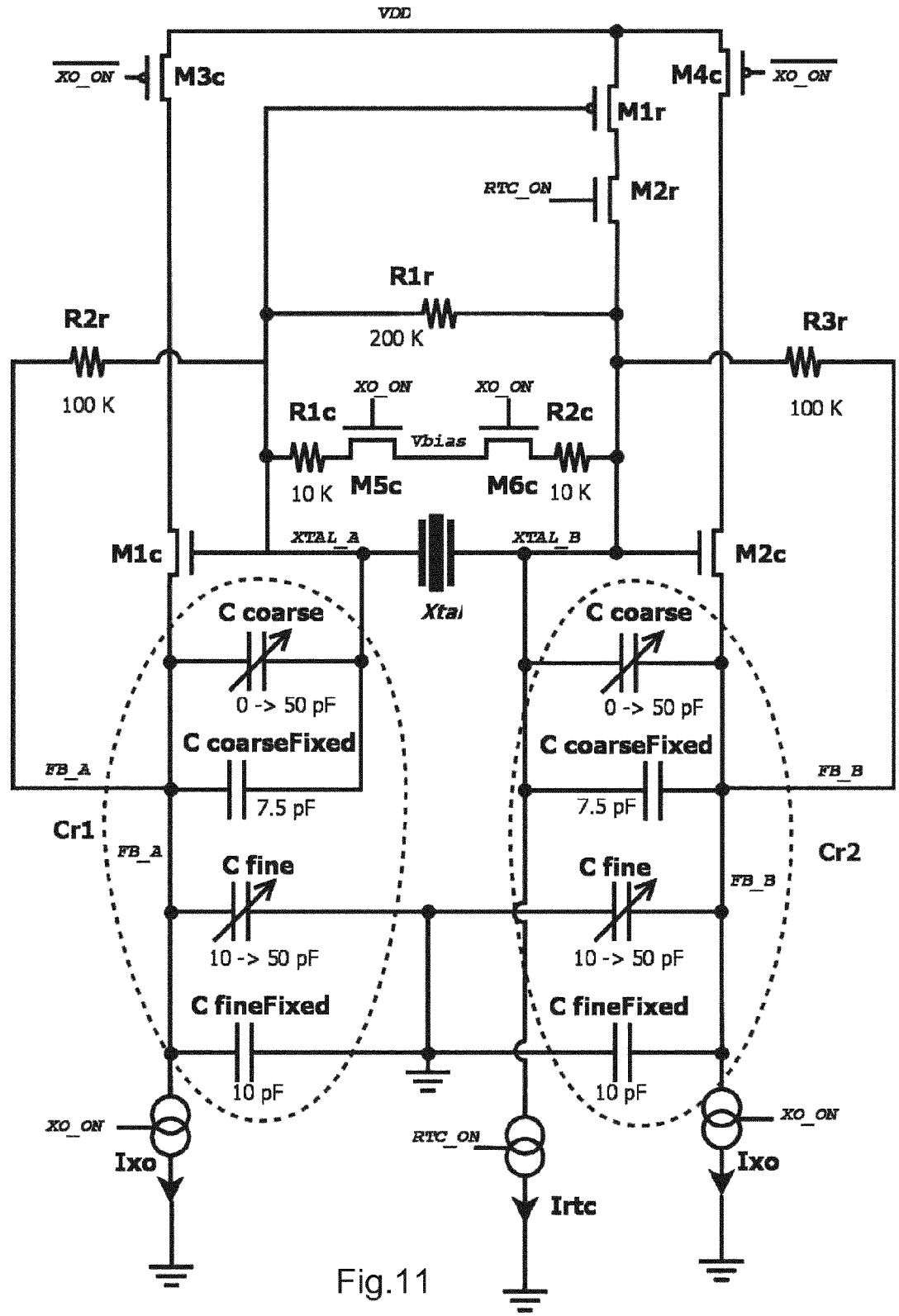
FIG. 11 shows an example of a first embodiment of a dual core oscillator.

FIG. 11 shows an example of a dual core oscillator according to a first embodiment. Two commands XO_ON and RTC_ON allow for switching between modes. When command XO_ON is ON, command RTC_ON is OFF; we are then in first higher frequency mode with a first architecture. When the command XO_ON is OFF, command RTC_ON is ON; we are then in second lower frequency mode with second architecture.

The dual core oscillator comprises a crystal Xtal, a current source Irtc, current sources Ixo, NMOS-type transistors M1c, M2c, M5c, M6c, PMOS-type transistors M3c, M4c, M1r, resistors R1c, R2c, R1r, R2r, R3r, and for each bank, tank capacitances Ccoarse, CcoarseFixed, Cfine, CfineFixed. The tank capacitances Ccoarse, CcoarseFixed, Cfine, CfineFixed are common to both modes because they are kept in use when switching from one mode to the other. The configuration of the dual core oscillator in the second lower frequency mode making equal to a tank capacitance Cr1 for the first bank and to a capacitance Cr2 for the second bank, the tank capacitances Ccoarse, CcoarseFixed, Cfine, CfineFixed, considered as a whole in their new way of being connected together.

In an example, Coarse value can vary from 0 to 50 pF, CcoarseFixed value is 7.5 pF, Cfine can value can vary from 10 to 50 pF, CfineFixed value is 10 pF. In this example, R1c and R2c value is 10 kohms, R2r and R3r value is 100 kohms, R1r value is 200 kohms.

Dual core oscillator presents a DC alimentation potential VDD, and other potentials, XTAL_A and XTAL_B, FB_A and FB_B, Vbias, and the ground.

When command XO_ON is ON, all NMOS-type transistors, whose gate is connected to command XO_ON, are passing transistors and all PMOS-type transistors, whose gate is connected to command XO_ON, are blocking transistors. When command XO_ON is OFF, all NMOS-type transistors, whose gate is connected to command XO_ON, are blocking transistors and all PMOS-type transistors, whose gate is connected to command XO_ON, are passing transistors. When command RTC_ON is ON, all NMOS-type transistors, whose gate is connected to command RTC_ON, are passing transistors and all PMOS-type transistors, whose gate is connected to command RTC_ON, are blocking transistors. When command RTC_ON is OFF, all NMOS-type transistors, whose gate is connected to command RTC_ON, are blocking transistors and all PMOS-type transistors, whose gate is connected to command RTC_ON, are blocking transistors. Gates of NMOS-type transistors M5c, M6c are connected to command XO_ON. Gates of PMOS-type transistors M3c, M4c are connected to the reverse of command XO_ON.

Current source Irtc has a grounded side and a non-grounded side, and is driven by command RTC_ON. When command RTC_ON is ON then current source Irtc is switched on; when command RTC_ON is OFF then current source Irtc is switched off. The non-grounded side of current source Irtc is connected to potential XTAL_B. Each current source Ixo has a grounded side and a non-grounded side, and is driven by command XO_ON. When command XO_ON is ON then current source Ixo is switched on; when command XO_ON is OFF then current source Ixo is switched off. The non-grounded side of one current source Ixo is connected to potential FB_A. The non-grounded side of the other current source Ixo is connected to potential FB_B. One side of Crystal Xtal is connected to potential XTAL_A whereas the other side of Crystal Xtal is connected to potential XTAL_B.

Resistor R1c is connected between potential XTAL_A and drain of transistor M5c. Source of transistor M5c is connected to potential Vbias. Resistor R2c is connected between potential XTAL_B and drain of transistor M6c. Source of transistor M6c is connected to potential Vbias.

Source of PMOS transistor M3c is connected to potential VDD and drain of PMOS transistor M3c is connected to drain of transistor M1c. Source of transistor M1c is connected to potential FB_A. Source of PMOS transistor M4c is connected to potential VDD and drain of PMOS transistor M4c is connected to drain of transistor M2c. Source of transistor M2c is connected to potential FB_B.

For one bank, tank capacitances Ccoarse and CcoarseFixed are connected in parallel between potential XTAL_A and potential FB_A, whereas tank capacitances Cfine and CfineFixed are connected in parallel between potential FB_A and the ground. For the other bank, tank capacitances Ccoarse and CcoarseFixed are connected in parallel between potential XTAL_B and potential FB_B, whereas tank capacitances Cfine and CfineFixed are connected in parallel between potential FB_B and the ground.

Resistor R2r is connected between potential XTAL_A and potential FB_A, whereas resistor R3r is connected between potential XTAL_B and potential FB_B. Resistor R1r is connected between potential XTAL_A and potential XTAL_B. Source of PMOS transistor M1r is connected to potential VDD and drain of PMOS transistor M1r is connected to potential XTAL_B. Gate of transistor M1r is connected to potential XTAL_A.

FIG. 11 shows a dual core oscillator adapted to switch from one core to the other, where the two cores are a differential Colpitts architecture which will be described in more detail with reference to FIG. 12 and a non differential Pierce architecture which will be described in more detail with reference to FIG. 3. Besides, some other elements have been added to the Colpitts architecture and the Pierce architecture, in order to handle the switching from one architecture to the other.

Figure 12:
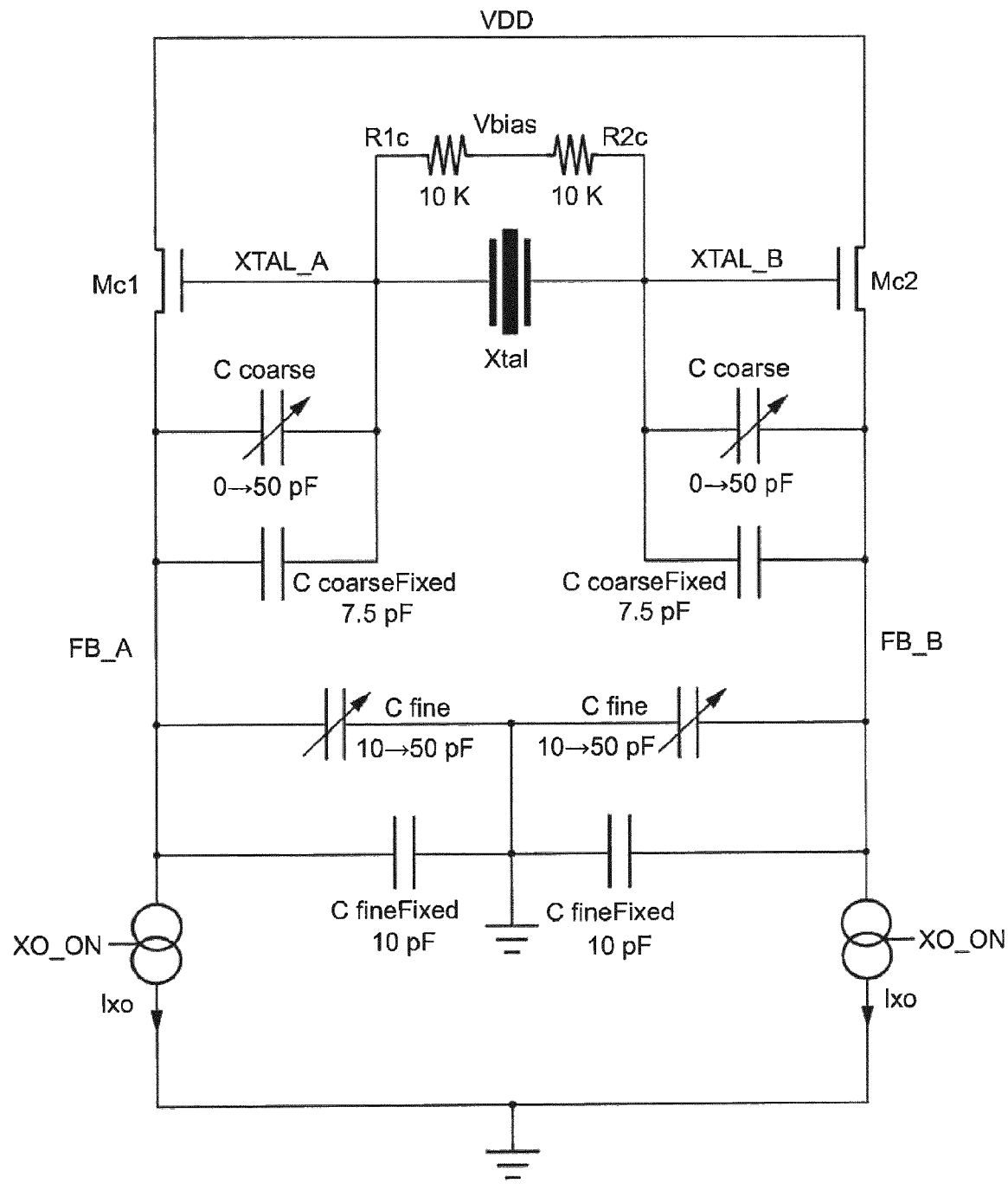
FIG. 12 shows a Colpitts architecture used to build a first architecture of higher frequency mode in an example of a first embodiment a dual core oscillator.

When the dual core oscillator is in the first mode, with lower noise and higher power consumption, to generate a clock signal at higher frequency, for example 26 MHz, the architecture used is similar to the architecture shown in FIG. 12, which is a differential Colpitts architecture. When the dual core oscillator switches to the second mode, with higher noise and lower power consumption, to generate a clock signal at lower frequency, for example 32 kHz, the architecture used is similar to the architecture shown in FIG. 13, which is a non-differential Pierce architecture.

A main feature of this embodiment is the reuse of the coarse and fine capacitance banks instead of adding new capacitances, when switching from one mode to the other. Those coarse and fine capacitance banks are making up the tank capacitances. The tank comprises the crystal and the tank capacitances. The low power goal is achieved, among other things, by reducing the load capacitance. The coarse and fine capacitances of the Colpitts architecture are too big to meet this objective. However, the coarse and fine capacitances of the Colpitts architecture can be connected in series, thus reducing the total value of tank capacitances of both banks of the Colpitts architecture, simply by switching OFF the Ixo current sources. In this way, there is no switch connected in series with the tank capacitances of both banks of the Colpitts architecture, at any moment, thus reducing the losses and the power consumption.

In lower frequency mode, while using the Pierce architecture, the nodes FB_A and FB_B would not have any DC path, once the Ixo current sources have been switched OFF, which may lead to unpredictable voltages at these nodes. The elements R2r and R3r have thus been added to the original Pierce architecture to feed the nodes XTAL_A and XTAL_B biasing voltages to the nodes FB_A and FB_B. The resistors R2r and R3r have preferably a high value in order to avoid degrading the tank quality factor.

To let the circuit operate in the lower frequency mode by using a Pierce architecture, some more switching elements have been further added. The transistors M3c and M4c cut off the biasing current in transistors M1c and M2c when the oscillations are present at nodes XTAL_A and XTAL_B. The transistors M5c and M6c disconnect the resistors R1c and R2c whose relatively low values would add too many losses to the tank.

In the higher frequency mode, when using the Colpitts architecture, the current source Irtc is switched OFF, thus presenting an open circuit to the transistor M1r which is not biased anymore. The resistors R2r and R3r remain connected but have negligible influence because R1c and R2c, which are connected in parallel, are far smaller.

With a 26-MHz crystal the Colpitts architecture, used in the higher frequency mode, power consumption is typically 900 µA, while the Pierce architecture, used in the lower frequency mode, can operate with as low as 5 to 10 µA power consumption.

FIG. 12 shows original Colpitts architecture used to build the first architecture of the higher frequency mode in an example of a dual core oscillator according to a first embodiment. The original Colpitts architecture comprises crystal Xtal, current sources Ixo, transistors M1c, M2c, resistors R1c, R2c, and for each bank, tank capacitances Ccoarse, CcoarseFixed, Cfine, CfineFixed.

Each current source Ixo has a grounded side and a non-grounded side, and is driven by command XO_ON. The non-grounded side of one current source Ixo is connected to potential FB_A. The non-grounded side of the other current source Ixo is connected to potential FB_B. One side of Crystal Xtal is connected to potential XTAL_A whereas the other side of Crystal Xtal is connected to potential XTAL_B.

Resistor R1c is connected between potential XTAL_A and potential Vbias. Resistor R2c is connected between potential XTAL_B and potential Vbias.

Drain of transistor M1c is connected to potential VDD and source of transistor M1c is connected to potential FB_A. Drain of transistor M2c is connected to potential VDD and source of transistor M2c is connected to potential FB_B.

For one bank, tank capacitances Ccoarse and CcoarseFixed are connected in parallel between potential XTAL_A and potential FB_A, whereas tank capacitances Cfine and CfineFixed are connected in parallel between potential FB_A and the ground. For the other bank, tank capacitances Ccoarse and CcoarseFixed are connected in parallel between potential XTAL_B and potential FB_B, whereas tank capacitances Cfine and CfineFixed are connected in parallel between potential FB_B and the ground.

This differential Colpitts architecture provides for a high-power low-noise oscillator core. It is a well-known differential Colpitts architecture widely used for its low noise capability. The crystal device Xtal is used in its fundamental tone and in its anti-resonance mode. The transistors M1c and M2c make up the amplifier that sustains the oscillation. The capacitive feedback, Ccoarse/CcoarseFixed on one hand, and Cfine/CfineFixed on the other hand, injects a fraction of voltage present at node XTAL_A to the source of M1c at node FBA.

The capacitive load seen by the crystal is:

$$(Ccoarse+CcoarseFixed)*(Cfine+CfineFixed)/(Ccoarse+CcoarseFixed+Cfine+CfineFixed)/2.$$

Figure 13:
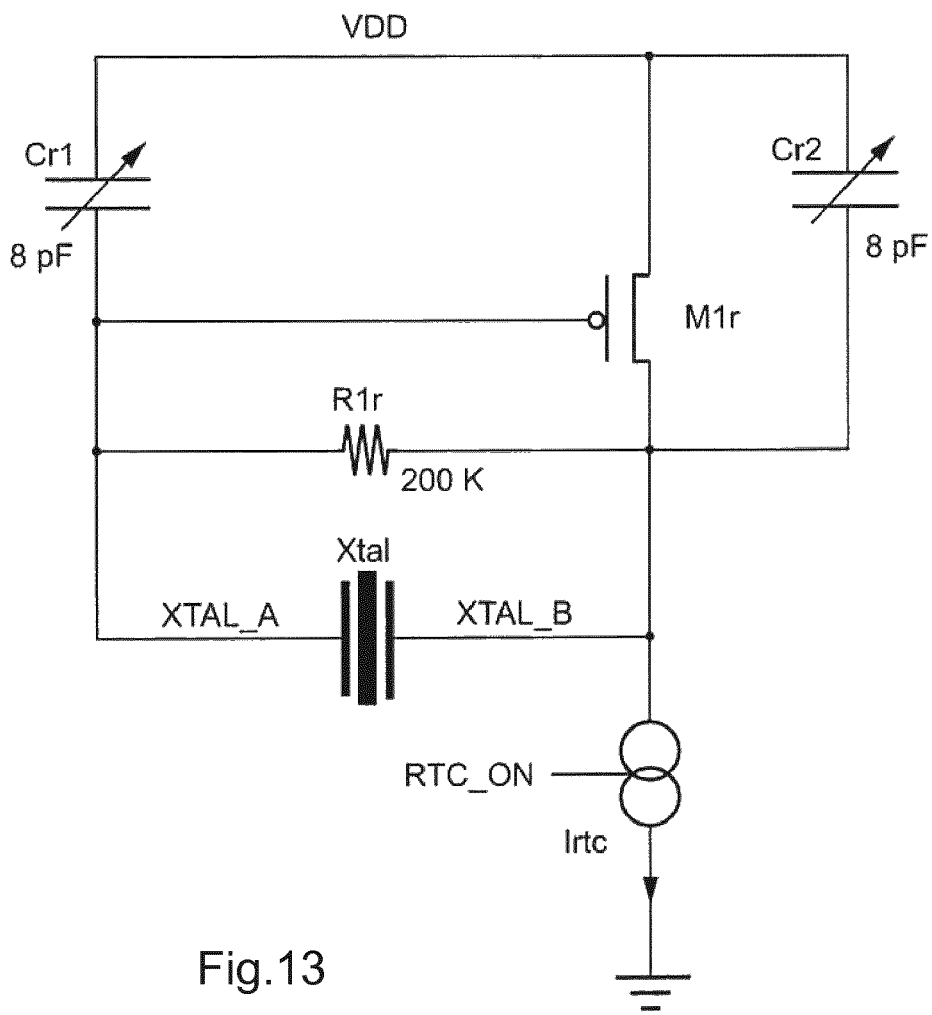
FIG. 13 shows a Pierce architecture used to build a second architecture of lower frequency mode in an example of first embodiment of a dual core oscillator.

FIG. 13 shows the original Pierce architecture used to build the second architecture of the lower frequency mode in an example of a dual core oscillator according to a first embodiment. The original Pierce architecture comprises a crystal Xtal, a current source Irtc, transistor M1r, resistor R1r and for each bank, tank capacitances Cr1 and Cr2. The tank capacitances Cr1 and Cr2 are got from the tank capacitances Ccoarse, CcoarseFixed, Cfine, CfineFixed connected in another way than in FIG. 12.

Current source Irtc has a grounded side and a non-grounded side, and is driven by command RTC_ON. The non-grounded side of current source Irtc is connected to potential XTAL_B. One side of Crystal Xtal is connected to potential XTAL_A whereas the other side of Crystal Xtal is connected to potential XTAL_B. Tank capacitance Cr1 is connected between potential VDD and potential XTAL_A. Tank capacitance Cr2 is connected between potential VDD and potential XTAL_B. Both tank capacitances can be finely varied around a nominal value which is for example 8 pF.

Resistor R1r is connected between potential XTAL_A and potential XTAL_B. Source of PMOS transistor M1r is connected to potential VDD and drain of PMOS transistor M1r is connected to potential XTAL_B. Gate of transistor M1r is connected to potential XTAL_A.

This single (non-differential) Pierce architecture provides for a low-power high-noise oscillator core. It is a commonly used Pierce architecture where a single transistor M1r is used to maintain the oscillations at the tank which is made up of the crystal Xtal and Cr1 and Cr2 tank capacitances. The structure is not differential in order to reduce the power consumption. Compared to a differential structure, this structure creates more noise and is more sensitive to external perturbations. As in the real-time clock mode the only active block within a transceiver is this very oscillator core, this drawback has little impact, and the main objective, reducing the power consumption, can be favoured.

The load capacitance seen by the crystal is: $Cr1*Cr2/(Cr1+Cr2)$ with: $Cr1=Cr2=(Ccoarse+CcoarseFixed)*(Cfine+CfineFixed)/(Ccoarse+CcoarseFixed+Cfine+CfineFixed)$.

Making equal the values of Cr1 and Cr2 would give the best trade-off between power consumption and frequency stability. However, as the structure is not a differential one, as an alternative, Cr1 may not be equal to Cr2 and the control circuitry of the capacitor banks could be modified to have an independent control of the left and right banks. Then, it would be possible to further reduce the power consumption provided the frequency stability remains within specifications.

The resistor R1r has preferably a high value in order to avoid degrading the tank quality factor and then, increasing the power consumption. The frequency tuning is done by varying Cr1 and Cr2.

Figure 14:
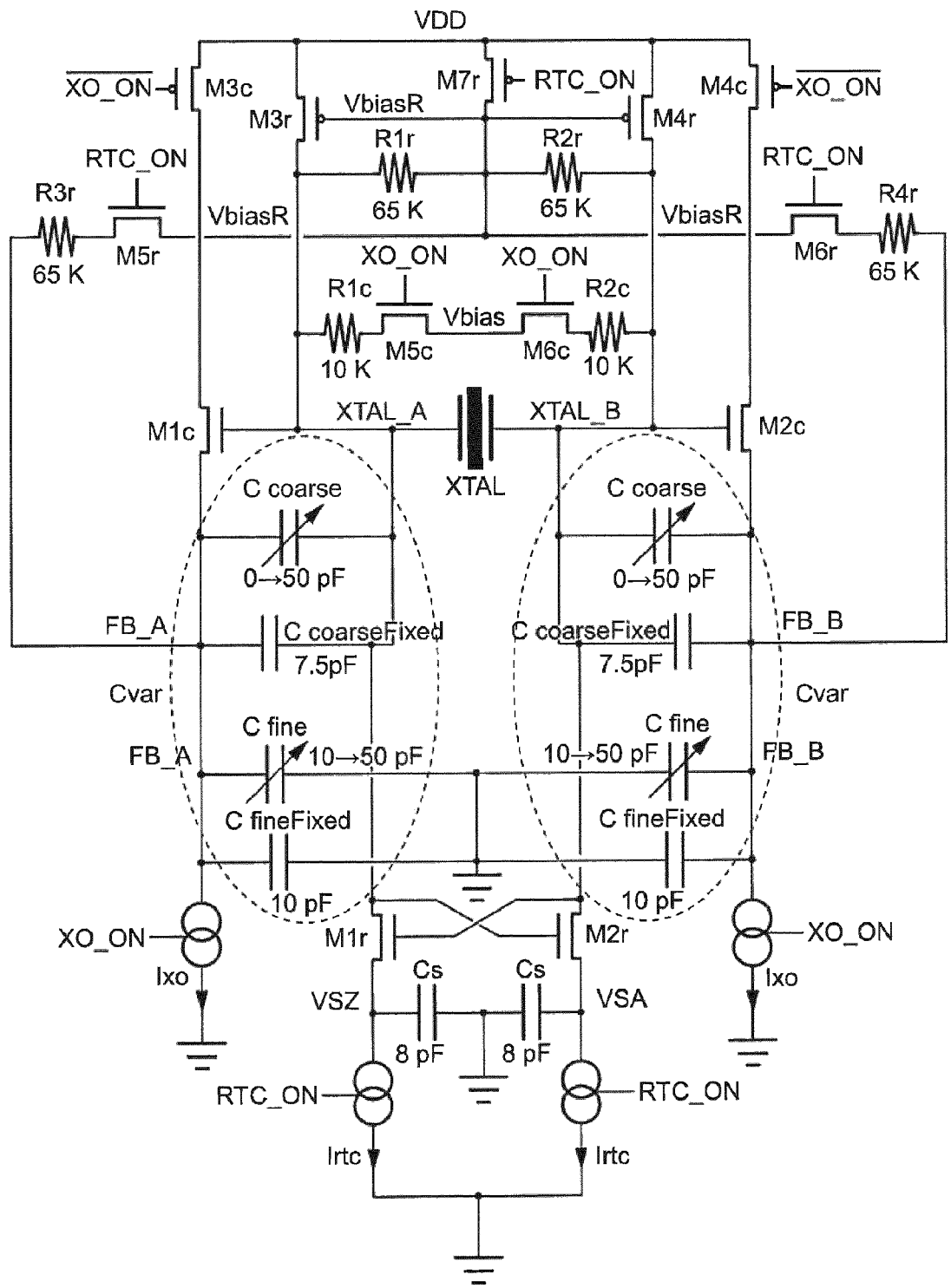
FIG. 14 shows an example of a second embodiment of a dual core oscillator.

FIG. 14 shows an example of a dual core oscillator according to a second embodiment. Two commands XO_ON and RTC_ON allow for switching between modes. When command XO_ON is ON, command RTC_ON is OFF; we are then in first higher frequency mode with first architecture. When command XO_ON is OFF, command RTC_ON is ON; we are then in second lower frequency mode with second architecture.

The dual core oscillator comprises a crystal Xtal, current sources Irtc, current sources Ixo, NMOS-type transistors M1c, M2c, M5c, M6c, M1r, M2r, M3r, M4r, M5r, M6r, PMOS-type transistors M3c, M4c, M7r, resistors R1c, R2c, R1r, R2r, R3r, R4r, and for each bank, tank capacitances Ccoarse, CcoarseFixed, Cfine, CfineFixed. The tank capacitances Ccoarse, CcoarseFixed, Cfine, CfineFixed are common to both modes because they are kept in use when switching from one mode to the other. The configuration of the dual core oscillator in the second lower frequency mode makes equal to a tank capacitance Cvar for both the first bank and the second bank, the tank capacitances Ccoarse, CcoarseFixed, Cfine, CfineFixed, taken as a whole in their new way of being connected together. We have also capacitances Cs.

In an example, Coarse value can vary from 0 to 50 pF, CcoarseFixed value is 7.5 pF, Cfine can value can vary from 10 to 50 pF, CfineFixed value is 10 pF, Cs value is 8 pF. In this example, R1c and R2c value is 10 kohms, R1r and R2r as well as R3r and R4r value is 65 kohms.

The dual core oscillator presents a DC alimentation potential VDD, and other potentials, XTAL_A and XTAL_B, FB_A and FB_B, Vbias, VbiasR, VSZ and VSA, and the ground.

When command XO_ON is ON, all NMOS-type transistors, whose gate is connected to command XO_ON, are passing transistors and all PMOS-type transistors, whose gate is connected to command XO_ON, are blocking transistors. When command XO_ON is OFF, all NMOS-type transistors, whose gate is connected to command XO_ON, are blocking transistors and all PMOS-type transistors, whose gate is connected to command XO_ON, are passing transistors. When command RTC_ON is ON, all NMOS-type transistors, whose gate is connected to command RTC_ON, are passing transistors and all PMOS-type transistors, whose gate is connected to command RTC_ON, are blocking transistors. When command RTC_ON is OFF, all NMOS-type transistors, whose gate is connected to command RTC_ON, are blocking transistors and all PMOS-type transistors, whose gate is connected to command RTC_ON, are blocking transistors. Gates of NMOS-type transistors M5c, M6c are connected to command XO_ON. Gates of PMOS-type transistors M3c, M4c are connected to the reverse of XO_ON. Gates of NMOS-type transistors M5r, M6r are connected to command RTC_ON. Gate of PMOS-type transistor M7r is connected to command RTC_ON.

Each current source Irtc has a grounded side and a non-grounded side, and is driven by command RTC_ON. The non-grounded side of current source Irtc of one bank is connected to potential VSZ, whereas the non-grounded side of current source Irtc of the other bank is connected to potential VSA. Each current source Ixo has a grounded side and a non-grounded side, and is driven by command XO_ON. The non-grounded side of one current source Ixo is connected to potential FB_A. The non-grounded side of the other current source Ixo is connected to potential FB_B. One side of Crystal Xtal is connected to potential XTAL_A whereas the other side of Crystal Xtal is connected to potential XTAL_B.

Resistor R1c is connected between potential XTAL_A and drain of transistor M5c. Source of transistor M5c is connected to potential Vbias. Resistor R2c is connected between potential XTAL_B and drain of transistor M6c. Source of transistor M6c is connected to potential Vbias.

Source of transistor M3c is connected to potential VDD and drain of transistor M3c is connected to drain of transistor M1c. Source of transistor M1c is connected to potential FB_A. Source of transistor M4c is connected to potential VDD and drain of transistor M4c is connected to drain of transistor M2c. Source of transistor M2c is connected to potential FB_B.

For one bank, tank capacitances Ccoarse and CcoarseFixed are connected in parallel between potential XTAL_A and potential FB_A, whereas tank capacitances Cfine and CfineFixed are connected in parallel between potential FB_A and the ground. For the other bank, tank capacitances Ccoarse and CcoarseFixed are connected in parallel between potential XTAL_B and potential FB_B, whereas tank capacitances Cfine and CfineFixed are connected in parallel between potential FB_B and the ground.

Source of transistor M7r is connected to potential VDD and drain of transistor M7r is connected to potential VbiasR. Gate of transistor M7r is connected to command RTC_ON. Source of PMOS-type transistor M3r is connected to potential VDD and drain of PMOS-type transistor M3r is connected to potential XTAL_A. Gate of transistor M3r is connected to potential VbiasR. Source of PMOS-type transistor M4r is connected to potential VDD and drain of PMOS-type transistor M4r is connected to potential XTAL_B. Gate of transistor M4r is connected to potential VbiasR. Resistor R1r is connected between potential VbiasR and potential XTAL_A. Resistor R2r is connected between potential VbiasR and potential XTAL_B.

Resistor R3r is connected between drain of transistor M5r and potential FBA. Resistor R4r is connected between drain of transistor M6r and potential FB_B. Source of transistor M5r is connected to potential VbiasR. Gate of transistor M5r is connected to command RTC_ON. Source of transistor M6r is connected to potential VbiasR. Gate of transistor M6r is connected to command RTC_ON.

Drain of transistor M1r is connected to potential XTAL_A, source of transistor M1r is connected to potential VSZ, and gate of transistor M1r is connected to potential XTAL_B. Drain of transistor M2r is connected to potential XTAL_B, source of transistor M2r is connected to potential VSA, and gate of transistor M2r is connected to potential XTAL_A. Capacitance Cs of one bank is connected between potential VSZ and the ground. Capacitance Cs of the other bank is connected between potential VSA and the ground.

FIG. 14 shows a dual core oscillator adapted to switch from one core to the other, where the two cores correspond to a differential Colpitts architecture which has been described in more detail with reference to FIG. 12 and a differential relaxation architecture which will be described in more detail with reference to FIG. 15. Besides, some other elements have been added to the Colpitts architecture and the relaxation architecture, in order to handle the switching from one architecture to the other.

When the dual core oscillator is in the first mode, having lower noise and higher power consumption, to generate a clock signal at higher frequency, for example 26 MHz, the architecture used is similar to the architecture shown in FIG. 12, which is a differential Colpitts architecture. When the dual core oscillator switches to the second mode, having higher noise and lower power consumption, to generate a clock signal at lower frequency, for example 32 kHz, the architecture used is similar to the architecture shown in FIG. 5, which is a differential relaxation architecture.

Main feature of this embodiment is the reuse of the coarse and fine capacitance banks instead of adding too many new capacitances, when switching from one mode to the other. Those coarse and fine capacitance banks are the tank capacitances. The tank comprises the crystal and the tank capacitances. The low power goal is achieved, among other things, by reducing the load capacitance. The coarse and fine capacitances of the Colpitts architecture are too big to meet this objective. However, the coarse and fine capacitances of the Colpitts architecture can be connected in series, thus reducing the total value of tank capacitances of both banks of the Colpitts architecture, simply by switching OFF the Ixo current sources. In this way, there is no switch connected in series with the tank capacitances of both banks of the Colpitts architecture, at any moment, thus reducing the losses and the power consumption.

In lower frequency mode, while using a relaxation architecture, the nodes FB_A and FB_B do not have any DC path, once the Ixo current sources have been switched OFF. Without a DC biasing, their AC voltages may reach undesirable values. The elements M5r, M6r, R3r and R4r have thus been added to the original relaxation architecture to feed the VbiasR biasing voltage to the nodes FB_A and FB_B. The resistors R3r and R4r have preferably a high value in order to avoid degrading the tank quality factor.

To let the circuit operate flawlessly in the lower frequency mode by using the relaxation architecture, some more switching elements have been further added. The transistors M3c and M4c avoid any current in transistors M1c and M2c when the oscillations are present at nodes XTAL_A and XTAL_B. The transistors M5c and M6c disconnect the resistors R1c and R2c whose low values would add too many losses to the tank.

In the higher frequency mode, when using the Colpitts architecture, the current sources Irtc are switched OFF, thus presenting an open circuit to transistors M1r and M2r which are not biased anymore and do not play an active role in the circuit. The transistor M7r is short-circuiting VbiasR to VDD, thus switching OFF M3r and M4r. The gates of M1c and M2c are biased to Vbias through the resistors R1c and R2c. The resistors R1r and R2r remain connected but have negligible influence due to their high value. The transistors M1r and M2r being not biased, the capacitances Cs only have a second order influence on the global tank capacitance value. Alternatively, the Cs capacitances could be disconnected by adding two MOSFET switches in series with them.

With a 26-MHz crystal, and with the Colpitts architecture, in the higher frequency mode, power consumption is typically 900 μA, while the relaxation architecture, used in the lower frequency mode, can operate with as low as 30 μA power consumption.

Compared to the embodiment described with respect to FIGS. 11 to 13, the low-power mode consumption is higher but the relaxation architecture used in the lower frequency mode is a differential one.

Figure 15:
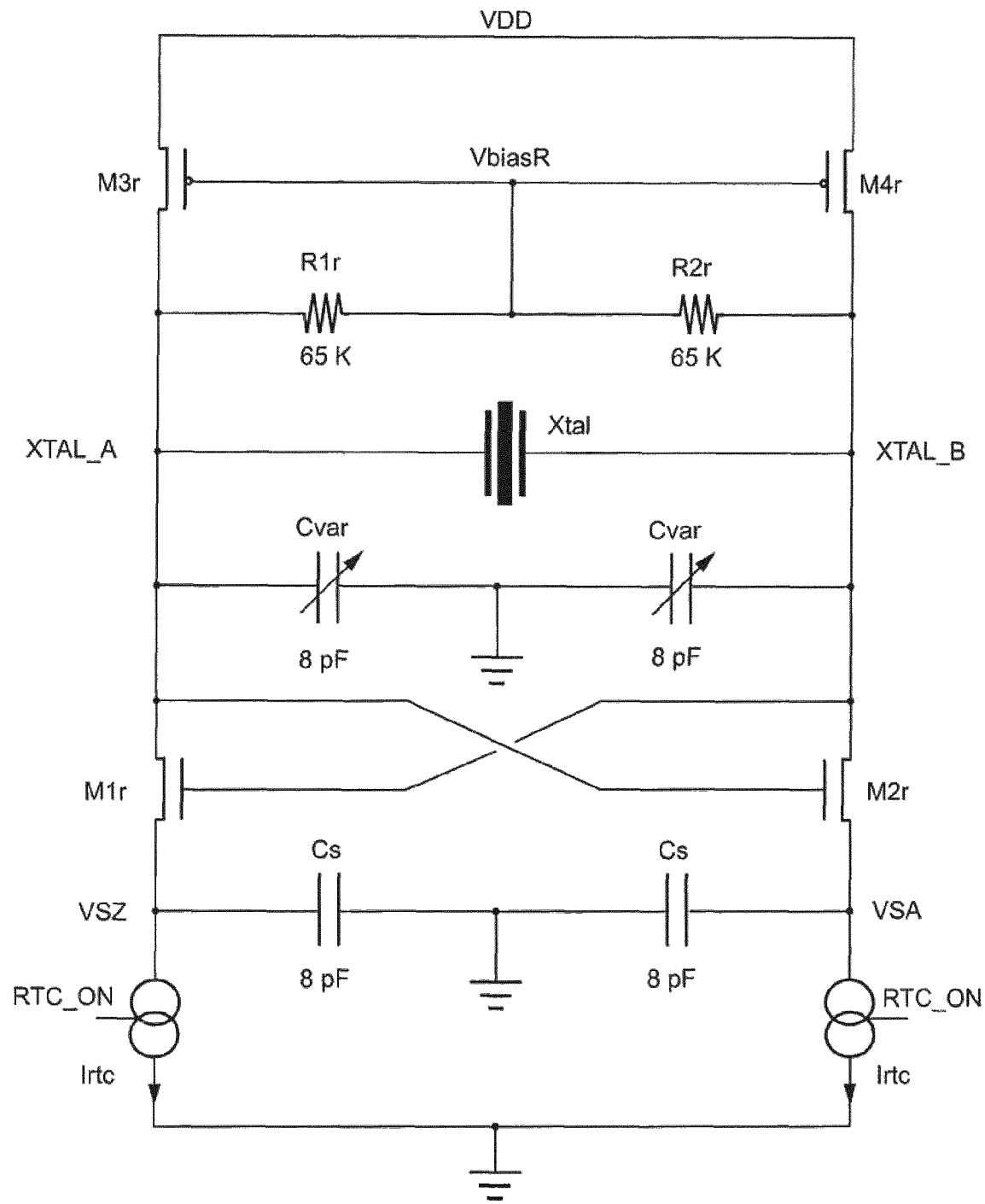
FIG. 15 shows a relaxation architecture used to build a second architecture of lower frequency mode in an example of a second embodiment of a dual core oscillator.

FIG. 15 shows the original relaxation architecture used to build a second architecture of the lower frequency mode in an example of a dual core oscillator according to a second embodiment. The original relaxation architecture comprises a crystal Xtal, current sources Irtc, transistors M1r, M2r, M3r, M4r, resistors R1r, R2r, and for each bank, tank capacitances Cvar. The tank capacitances Cvar are got from the tank capacitances Ccoarse, CcoarseFixed, Cfine, CfineFixed connected together in another way than in FIG. 12. We have also capacitances Cs. Tank capacitance Cvar of one bank is connected between potential XTAL_A and the ground. Tank capacitance Cvar of the other bank is connected between potential XTAL_B and the ground.

Each current source Irtc has a grounded side and a non-grounded side, and is driven by command RTC_ON. The non-grounded side of current source Irtc of one bank is connected to potential VSZ, whereas the non-grounded side of current source Irtc of the other bank is connected to potential VSA. One side of Crystal Xtal is connected to potential XTAL_A whereas other side of Crystal Xtal is connected to potential XTAL_B.

Source of PMOS-type transistor M3r is connected to potential VDD and drain of PMOS-type transistor M3r is connected to potential XTAL_A. Gate of transistor M3r is connected to potential VbiasR. Source of PMOS-type transistor M4r is connected to potential VDD and drain of PMOS-type transistor M4r is connected to potential XTAL_B. Gate of transistor M4r is connected to potential VbiasR. Resistor R1r is connected between potential VbiasR and potential XTAL_A. Resistor R2r is connected between potential VbiasR and potential XTAL_B.

Drain of transistor M1r is connected to potential XTAL_A, source of transistor M1r is connected to potential VSZ, and gate of transistor M1r is connected to potential XTAL_B. Drain of transistor M2r is connected to potential XTAL_B, source of transistor M2r is connected to potential VSA, and gate of transistor M2r is connected to potential XTAL_A. Capacitance Cs of one bank is connected between potential VSZ and the ground. Capacitance Cs of the other bank is connected between potential VSA and the ground.

This differential relaxation architecture provides for a low-power high-noise oscillator core. It is a commonly used relaxation architecture where a crystal Xtal and load capacitances Cvar have been added in order to accurately determine the frequency. The active transistors M1r and M2r are sustaining the oscillation while M3r, M4r, R1r and R2r impose the same current above and below the active transistors M1r and M2r. The resistors R1r and R2r have preferably a high value in order to avoid degrading the tank quality factor. The frequency tuning is done by varying Cvar. The capacitance Cs value is chosen in such a way as to assure the starting of the oscillation in all conditions.

Figure 16:
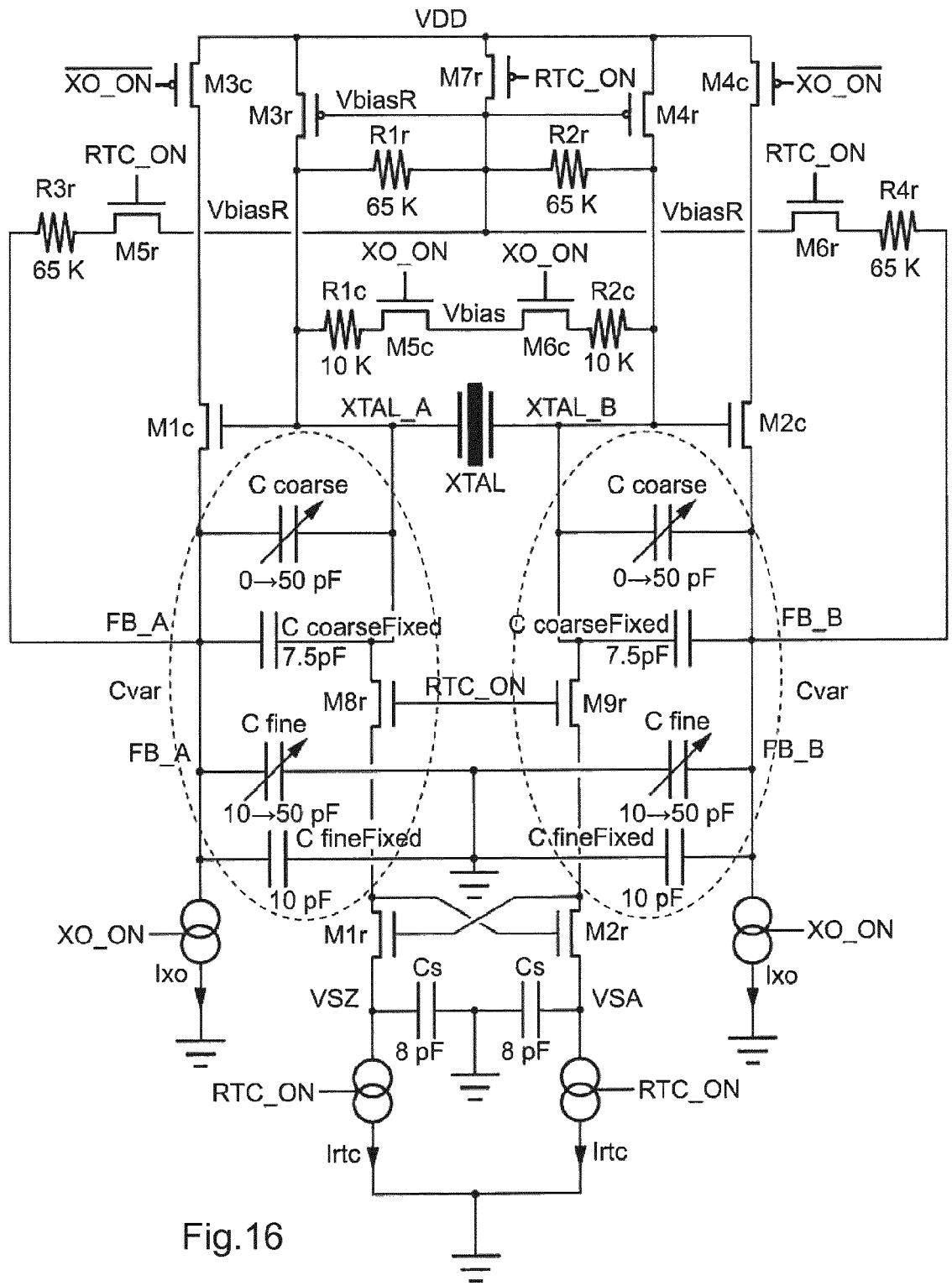
FIG. 16 shows an example of a third embodiment of a dual core oscillator.

FIG. 16 shows second architecture in use in another mode in an example of a dual core oscillator according to a third embodiment. Third embodiment is close to second embodiment shown in FIG. 14. Two MOSFET transistors have been added. Transistor M8r has its drain connected to potential XTAL_A, and transistor M9r has its drain connected to potential XTAL_B. Transistor M8r has its source connected to drain of transistor M1r, and transistor M9r has its source connected to drain of transistor M2r. Both transistor M8r and transistor M9r have their respective gates connected to the command RTC_ON. The added switches improve the phase noise performance of the higher frequency, low noise mode by completely disconnecting transistors M1r and M2r, and thus avoiding any remaining currents in the cross-coupled pair formed by transistors M1r and M2r.

Figure 17:
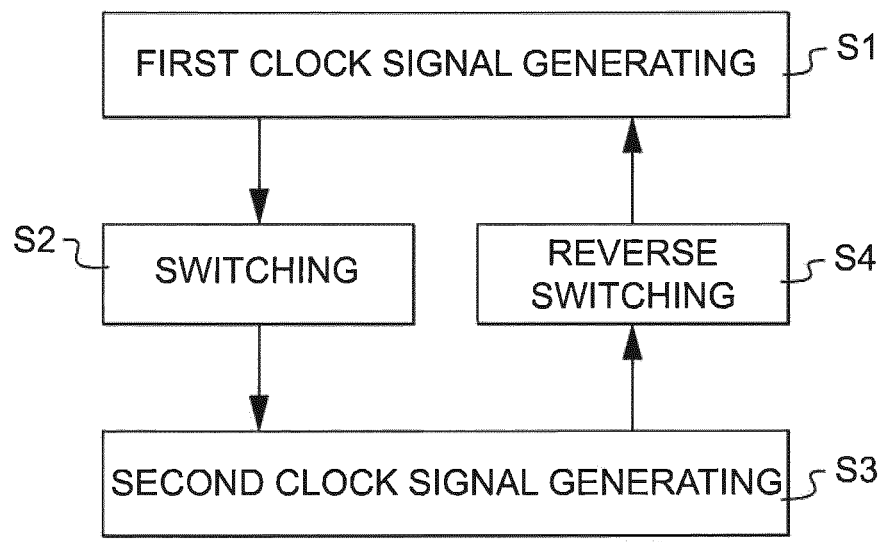
FIG. 17 shows an example of the different steps of a method generating a clock signal.

FIG. 17 shows an example of the different steps of a method generating a clock signal according to an embodiment. The method described in FIG. 17 can be performed with the help of the dual core oscillators described in FIG. 11, 14 or 16. The method comprises a step S1 generating a first clock signal, a step S3 of generating a second clock signal, a step S2 of switching in the dual core oscillator from the first architecture to the second architecture, a step S4 of reverse switching in the dual core oscillator from the second architecture to the first architecture. The first architecture, for example a Colpitts architecture, is dedicated to generate the first clock signal, at a relatively higher frequency, with relatively lower noise and higher power consumption, than the second clock signal. The second architecture, for example a Pierce or a relaxation architecture, is dedicated to generate the second clock signal, at a relatively lower frequency, with relatively higher noise and lower power consumption, than the first clock signal.

At step S1, the dual core oscillator is configured in the first architecture and works in the higher frequency mode, generating the first clock signal at higher frequency, for example 26 MHz or 38.4 MHz, or even 52 MHz. The dual core oscillator remains in step S1, when the higher frequency clock signal is needed, for example when the cellular transceiver of the mobile phone in which it is included, is in use.

At step S2, the dual core oscillator is reconfigured from the first architecture to the second architecture, in order to switch from first clock signal generation to second clock signal generation. The dual core oscillator goes to step S2, when higher frequency clock signal is no more needed, for example when the cellular transceiver is no more in use.

At step S3, the dual core oscillator is configured in the second architecture and works in the lower frequency mode, generating the second clock signal at the lower frequency, for example at 32 kHz. The dual core oscillator remains in step S3, when higher frequency clock signal is no more needed, for example when the cellular transceiver is no more in use. Then, only the lower frequency clock signal is needed, for example for real-time clock or for FM radio.

At step S4, the dual core oscillator is again reconfigured, but this time from the second architecture to first architecture, in order to switch from second clock signal generation to first clock signal generation. The dual core oscillator goes to step S4, when the higher frequency clock signal is again needed, for example when the cellular transceiver is again in use.

Figure 18:
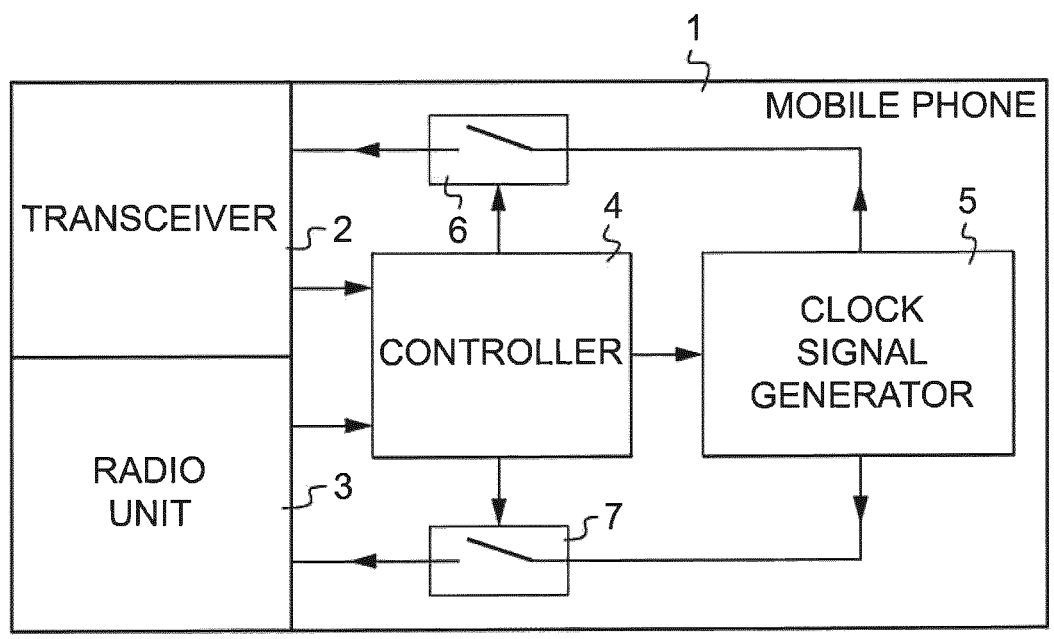
FIG. 18 shows an example of a mobile phone comprising a dual core oscillator.

FIG. 18 shows an example of a mobile phone comprising a dual core oscillator according to an embodiment. A mobile phone 1 for a cellular network comprises a cellular transceiver 2, a radio unit 3, a controller 4, a clock signal generator 5, and switches 6 and 7.

Transceiver 2 comprises a receiver and a transmitter adapted to allow cellular communications in the cellular network, for example with a base station. Radio unit 3 comprises an antenna and a loudspeaker in order to catch outside broadcasted audio and to play it on a loudspeaker. Clock signal generator 5 comprises a dual core oscillator which can be configured either in the first architecture to generate the first clock signal of a higher frequency for transceiver 2 or in the second architecture to generate the second clock signal of lower frequency for radio unit 3.

Controller 4 receives demands for a clock signal coming from transceiver 2 or radio unit 3. The controller 4 asks the clock signal generator 5 to configure itself in an architecture, first or second, corresponding to the needed frequency, higher or lower, to be generated by the clock signal generator 5. Once the clock signal generator 5 generates a clock signal, either first or second, the controller allows it to be forwarded to the transceiver 2 or to the radio unit 3, by controlling accordingly the switches 6 and 7. When switch 6 is closed and switch 7 is open, first clock signal of higher frequency goes to transceiver 2. When switch 7 is closed and switch 6 is open, second clock signal of lower frequency goes to radio unit 3.

Figure 19:
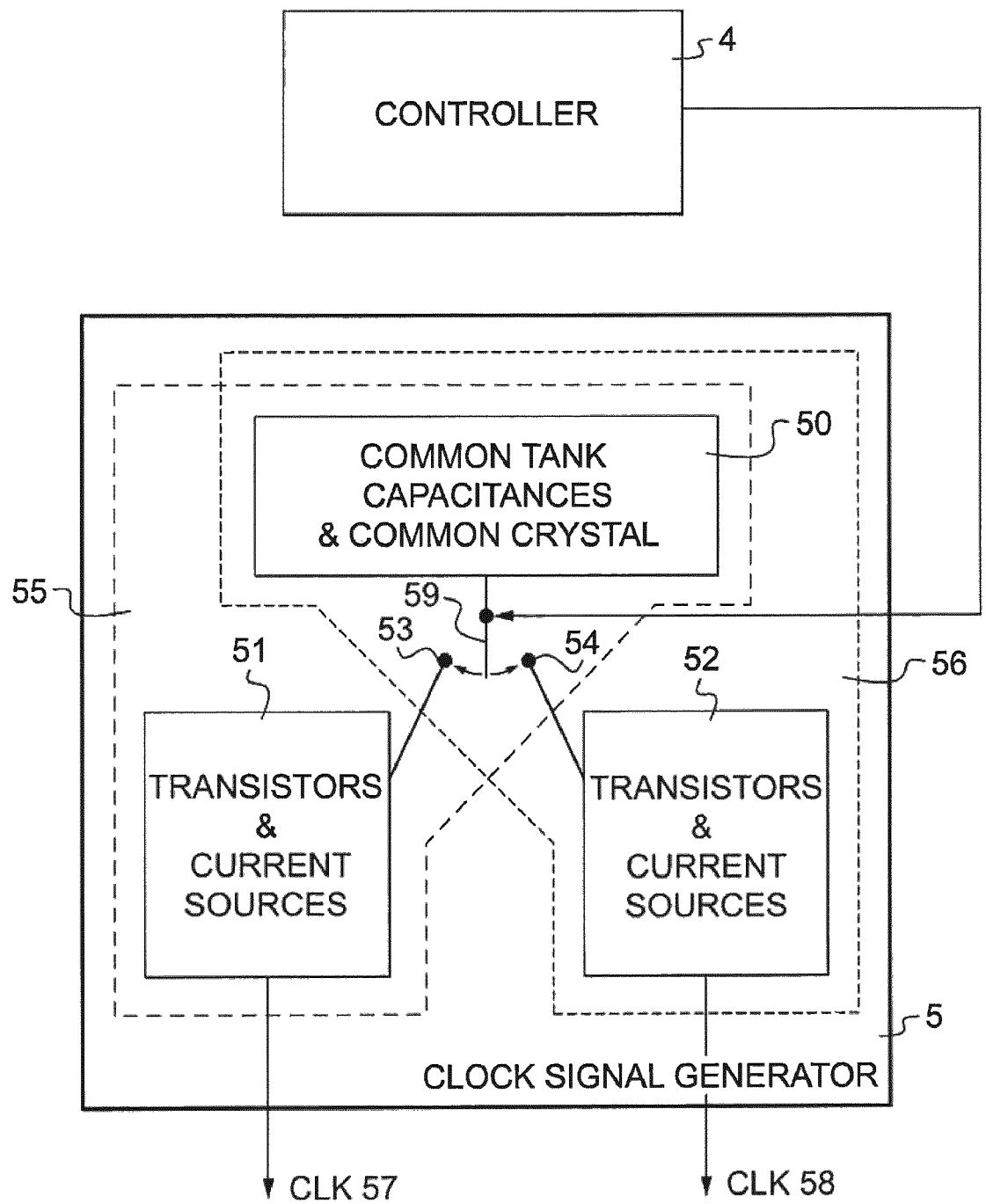
FIG. 19 shows an example of a detailed part of FIG. 18.

FIG. 19 shows an example of a detailed part of FIG. 18, according to an embodiment. Parts of clock signal generator 5 of FIG. 18 are shown as functional blocks. The clock signal generator 5 comprises a common tank 50 including common tank capacitances and a common crystal, a first group 51 of transistor(s) and current source(s), a second group 52 of transistor(s) and current source(s), and a switching unit 59. The dual core oscillator is a part of the clock signal generator 5 and comprises blocks 50, 51, 52 and 59.

Switching unit 59 can take two positions 53 and 54. In position 53, the common tank capacitances and the common crystal are connected in a first way to transistor(s) and current source(s) of the first group 51 in order to make up the first architecture 55, for example a differential Colpitts type architecture, which can generate first clock signal 57 at a higher frequency than second clock signal 58. In position 54, the common tank capacitances and the common crystal are connected in a second way to transistor(s) and current source(s) of second group 52 in order make up second architecture 56, for example a non differential Pierce type architecture or a differential relaxation type architecture, which can generate second clock signal 58 at a lower frequency than first clock signal 57.

The switching unit 59 is driven by controller 4 that commands switching between the first position 53 and the second position 54. The controller driving depends on requirements given by transceiver 2 and radio unit 3 of FIG. 18.

The global tank capacitance value is different between first architecture 55 and second architecture 56, due to different relative connection of common capacitances. The first clock signal 57, at higher frequency, is dedicated to transceiver 2 of FIG. 18. The second clock signal 58, at lower frequency, is dedicated to radio unit 3 of FIG. 18. The first clock signal 57, at higher frequency, has lower noise but higher power consumption than the second clock signal 58, at lower frequency.

In the embodiments of the dual core oscillator described with reference to FIGS. 11, 14 and 16, the tank capacitances Ccoarse, CcoarseFixed, Cfine, CfineFixed, may correspond respectively to the following capacitors of the tank circuit illustrated in FIG. 1: the first and fifth capacitors 25, 35; the second and sixth capacitors 26, 36; the third and seventh capacitors 27, 37; and the fourth and eighth capacitors 28, 38. Moreover, the tank capacitances Cr1, Cr2 described with reference to FIGS. 11, 14 and 16 may correspond to, respectively, the first and second capacitive devices Cr1, Cr2 described with reference to FIG. 1.

Another advantage of at least some embodiments of the oscillator, or dual core oscillator, is a lower calibration cost at the production stage, in particular when a crystal is employed. Each crystal oscillator must be calibrated to take into account the temperature dependence of the crystal frequency. The goal of this calibration is to find the tank capacitance value that will give the nominal desired frequency. Implicitly this process also takes into account the nominal capacitance shift due to manufacturing variations. Therefore, reusing capacitors alongside the same crystal for both high power and low power modes allows great simplification of, and in some cases suppression of, the calibration step in the low power mode, by relying on the calibration in the high power mode. With a prior art solution using two crystals, the requirement for two calibrations cannot be avoided as each crystal is connected to a distinct oscillator. A further advantage is a better behaviour of the oscillation when the oscillator is switched from one mode to the other. Since the energy of oscillation always remains stored within the same tank, what ever the mode, and because the quality factor of the crystal is very high, the frequency and phase of the oscillation are very likely to exhibit a continuous behaviour when switching between modes. This would not happen when switching between two distinct oscillators. Furthermore, since the components making up the oscillator tank are unchanged when switching between modes, variations due to aging and temperature will produce similar effects on both oscillation modes.

References herein to any of the first to twelfth switch elements Sw1 to Sw10, Sw16 and Sw17 having a relatively high impedance state correspond to the respective switch elements being switch off, and preferably the high impedance corresponds to an open circuit, that is, an infinite impedance. Conversely, references to any of the first to twelfth switch elements Sw1 to Sw10, Sw16 and Sw17 having a relatively low impedance state correspond to the respective switch elements being switch on, and preferably the low impedance corresponds to a short circuit, that is, a zero impedance. Likewise, references to any of the first, second, third and fourth switchable current sources Sw11 to Sw14 being switched off correspond to the respective switchable current sources having a relatively high impedance state, and preferably the high impedance corresponds to an open circuit, that is, an infinite impedance.

Other variations and modifications will be apparent to the skilled person. Such variations and modifications may involve equivalent and other features which are already known and which may be used instead of, or in addition to, features described herein. Features that are described in the context of separate embodiments may be provided in combination in a single embodiment. Conversely, features which are described in the context of a single embodiment may also be provided separately or in any suitable sub-combination.

It should be noted that the term "comprising" does not exclude other elements or steps, the term "a" or "an" does not exclude a plurality, a single feature may fulfil the functions of several features recited in the claims and reference signs in the claims shall not be construed as limiting the scope of the claims. It should also be noted that the Figures are not necessarily to scale; emphasis instead generally being placed upon illustrating the principles of the present invention.

The invention claimed is:

1. An oscillator comprising:
a tank circuit;
a first transistor and a second transistor, wherein the second transistor occupies an area of silicon that is smaller than an area of silicon occupied by the first transistor; and
a switching apparatus for selecting either one of a first oscillator topology and a second oscillator topology, wherein
in the first oscillator topology, the tank circuit is coupled to the first transistor in a first feedback configuration to provide feedback around the first transistor;
in the second oscillator topology, the tank circuit is coupled to the second transistor in a second feedback configuration that is different to the first feedback configuration to provide feedback around the second transistor;
the tank circuit comprises an inductive device having a first port coupled to a first port of a first capacitive device and having a second port coupled to a first port of a second capacitive device;
the first capacitive device comprises first and second capacitive elements coupled in series between the first port of the first capacitive device and a first voltage rail, and a second port arranged between the first and second capacitive elements and coupling the first and second capacitive elements to the first transistor; and
the second capacitive device comprises third and fourth capacitive elements coupled in series between the first port of the second capacitive device and the first voltage rail, and a second port arranged between the first and second capacitive elements.

2. An oscillator as claimed in claim 1, wherein at least one of the first, second, third and fourth capacitive elements comprises a variable capacitance.

3. An oscillator as claimed in claim 1, comprising:
a third transistor, wherein the second transistor occupies an area of silicon that is smaller than an area of silicon occupied by the third transistor, and whereby:
in the first feedback configuration the first and second capacitive elements constitute a first voltage divider arranged to feed back a proportion of a voltage at a gate of the first transistor to a first terminal of the first transistor and the third and fourth capacitive elements constitute a second voltage divider arranged to feed back a proportion of a voltage at a gate of the third transistor to a first terminal of the third transistor, and
in the second feedback configuration the first and second capacitive devices constitute a third voltage divider arranged to feed back a proportion of a voltage at a first terminal of the second transistor to a gate of the second transistor.

4. An oscillator as claimed in claim 3, wherein:
a first resistive element is coupled between the first and second ports of the inductive device;
the first port of the inductive device is coupled to the second port of the first capacitive device by means of a second resistive element;
the second port of the inductive device is coupled to the second port of the second capacitive device by means of a third resistive element;
the gate of the first transistor is coupled to a first bias voltage rail by means of a fourth resistive element, and to the first port of the inductive device, and the first terminal of the first transistor is coupled to the second port of the first capacitive device;
the gate of the second transistor is coupled to the first port of the inductive device, the first terminal of the second transistor is coupled to the second port of the inductive device by means of a fifth switch element, and a second terminal of the second transistor device is coupled to a second voltage rail;
the gate of the third transistor is coupled to the first bias voltage rail by means of a fifth resistive element, and to the second port of the inductive device, and the first terminal of the third transistor is coupled to the second port of the second capacitive device; and
the switching apparatus comprises:
a first switch element coupled between a second terminal of the first transistor and the second voltage rail,
a second switch element coupled in series with the fourth resistive element for decoupling the gate of the first transistor from the first bias voltage rail,
a third switch element coupled between a second terminal of the third transistor and the second voltage rail,
a fourth switch element coupled in series with the fifth resistive element for decoupling the gate of the third transistor from the first bias voltage rail,
the fifth switch element,
a first switchable current source coupled between the second port of the first capacitive device and the first voltage rail,
a second switchable current source coupled between the second port of the inductive device and the first voltage rail, and
a third switchable current source coupled between the second port of the second capacitive device and the first voltage rail.

5. An oscillator as claimed in claim 4, wherein the switching apparatus comprises a control stage arranged to control the first, second, third, fourth and fifth switch elements, and the first, second and third switchable current sources such that,
when the first oscillator topology is selected:
the first, second, third and fourth switch elements each have a relatively low impedance state;
the fifth switch element has a relatively high impedance state;

the first switchable current source sources a first current;
the second switchable current source is switched off; and
the third switchable current source sources a second current; and when the second oscillator topology is selected:
the first, second, third and fourth switch elements each have a relatively high impedance state;
the fifth switch element has a relatively low impedance state;
the first and third switchable current sources are each switched off; and
the second switchable current source sources a third current.

6. An oscillator as claimed in claim 5, comprising:
an eleventh switch element coupled in series with the second resistive element for decoupling the first port of the inductive device from the second port of the first capacitive device; and
a twelfth switch element coupled in series with the third resistive element for decoupling the second port of the inductive device from the second port of the second capacitive device;
wherein the control stage is arranged to control the eleventh and twelfth switch elements such that, when the first oscillator topology is selected, the eleventh and twelfth switch elements have a relatively high impedance state, and when the second oscillator topology is selected, the eleventh and twelfth switch elements have a relatively low impedance state.

7. An oscillator as claimed in claim 3, wherein:
the gate of the first transistor is coupled to a first bias voltage rail by means of a fourth resistive element, to a second bias voltage by means of a sixth resistive element, and to the first port of the inductive device and the first terminal of the first transistor is coupled to the second port of the first capacitive device;
the first terminal of the second transistor is coupled to the first port of the inductive device, and the second terminal of the second transistor is coupled to the first voltage rail by means of a fifth capacitive element;
the gate of the third transistor is coupled to the first bias voltage rail by means of a fifth resistive element, to the second bias voltage rail by means of a seventh resistive element, and to the second port of the inductive device, and the first terminal of the third transistor is coupled to the second port of the second capacitive device;
the oscillator further comprises:
a fourth transistor having a first terminal coupled to the second port of the inductive device and a second terminal coupled to the first voltage rail by means of a sixth capacitive element, wherein a gate of the fourth transistor is coupled to the first terminal of the second transistor and the first terminal of the fourth transistor is coupled to the gate of the second transistor;
a fifth transistor having a first terminal coupled to the first port of the inductive device, a second coupled to the second voltage rail, and a gate of the fifth transistor coupled to the second bias voltage rail;
a sixth transistor device having a first terminal coupled to the second port of the inductive device, a second terminal coupled to the second voltage rail, and
a gate of the sixth transistor coupled to the second bias voltage rail;
the second port of the first capacitive device is coupled to the second bias voltage rail by means of an eighth resistive element;
the second port of the second capacitive device is coupled to the second bias voltage rail by means of a ninth resistive element; and
the switching apparatus comprises:
a first switch element coupled between a second terminal of the first transistor and the second voltage rail;
a second switch element coupled in series with the fourth resistive element for decoupling the gate of the first transistor from the first bias voltage rail;
a third switch element coupled between a second terminal of the third transistor and the second voltage rail;
a fourth switch element coupled in series with the fifth resistive element for decoupling the gate of the third transistor from the first bias voltage rail;
a sixth switch element coupling the gate of the fifth transistor and the gate of the sixth transistor to the second voltage rail;
a seventh switch element coupling the sixth and eighth resistive elements to the second bias voltage rail, and arranged for decoupling the second port of the first capacitive device and the gate of the first transistor from the second bias voltage rail;
an eighth switch element coupling the seventh and ninth resistive elements to the second bias voltage rail, and arranged for decoupling the second port of the second capacitive device and the gate of the third transistor from the second bias voltage rail;
a first switchable current source coupled between the second port of the first capacitive and the first voltage rail;
a second switchable current source coupled between the second terminal of the second transistor and the first voltage rail;
a third switchable current source coupled between the second port of the second capacitive device and the first voltage rail; and
a fourth switchable current source coupled between the second terminal of the fourth transistor and the first voltage rail.

8. An oscillator as claimed in claim 7, wherein the switching apparatus comprises a control stage arranged to control the first, second, third, fourth, sixth, seventh and eighth switch elements and the first, second, third and fourth switchable current sources such that,
when the first oscillator topology is selected:
the first, third, seventh and eighth switch elements each have a relatively low impedance state;
the second and fourth switch elements each have a relatively high impedance state;
the first switchable current source sources a first current;
the third switchable current source sources a second current; and
the second and fourth switchable current sources are each switched off; and
when the second oscillator topology is selected:
the first, third, seventh and eighth switch elements each have a relatively high impedance state;
the second and fourth switch elements each have a relatively low impedance state;
the first and third switchable current sources are each switched off;
the second switchable current source sources a third current; and
the fourth switchable current source sources a fourth current.

9. An oscillator as claimed in claim 7, wherein
the switching apparatus further comprises an ninth switch element and a tenth switch element, wherein the first terminal of the second transistor is coupled to the first port of the inductive device by means of the ninth switch element and the first port of the fourth transistor is coupled to the second port of the inductive device by means of the tenth switch element, and wherein the control stage is arranged to control the ninth and tenth switch elements such that
when the first oscillator topology is selected, the ninth and tenth switch elements each have a relatively high impedance state, and
when the second oscillator topology is selected, the eighth and tenth switch elements each have a relatively low impedance state.

10. An oscillator as claimed in claim 1, wherein the inductive device is a piezoelectric device.

11. An oscillator as claimed in claim 10, wherein the piezoelectric device is a quartz crystal.

12. An electronic apparatus comprising an oscillator according to claim 1.

13. An electronic apparatus as claimed in claim 12, wherein the electronic apparatus is a wireless communication apparatus.

14. A method of operating an oscillator comprising selecting either one of a first oscillator topology and a second oscillator topology, wherein selecting the first oscillator topology comprises coupling a tank circuit to a first transistor in a first feedback configuration to provide feedback around the first transistor, and selecting the second oscillator topology comprises coupling the tank circuit to a second transistor in a second feedback configuration that is different to the first feedback configuration to provide feedback around the second transistor, wherein the second transistor occupies an area of silicon that is smaller than an area of silicon occupied by the first transistor, wherein the tank circuit comprises an inductive device having a first port coupled to a first port of a first capacitive device and having a second port coupled to a first port of a second capacitive device, wherein the first capacitive device comprises first and second capacitive elements coupled in series between the first port of the first capacitive device and a first voltage rail, and a second port arranged between the first and second capacitive elements and coupling the first and second capacitive elements to the first transistor.

* * * * *